(12) United States Patent
Donderici et al.

(10) Patent No.: US 9,829,600 B2
(45) Date of Patent: Nov. 28, 2017

(54) DIRECT COUPLING CANCELLATION WITH A COMBINATION OF SENSOR TILT ANGLES

(75) Inventors: Burkay Donderici, Houston, TX (US); Michael S. Bittar, Houston, TX (US)

(73) Assignee: HALLIBURTON ENERGY SERVICES, INC., Houston, TX (US)

(*) Notice: Subject to any disclaimer, the term of this patent is extended or adjusted under 35 U.S.C. 154(b) by 1079 days.

(21) Appl. No.: 13/981,547

(22) PCT Filed: Jan. 25, 2011

(86) PCT No.: PCT/US2011/022421
§ 371 (c)(1),
(2), (4) Date: Jul. 24, 2013

(87) PCT Pub. No.: WO2012/102705
PCT Pub. Date: Aug. 2, 2012

(65) Prior Publication Data
US 2013/0311094 A1 Nov. 21, 2013

(51) Int. Cl.
*G01V 3/28* (2006.01)
*G01R 27/26* (2006.01)
*G01V 3/30* (2006.01)
*G01V 3/08* (2006.01)
*G01V 3/10* (2006.01)

(52) U.S. Cl.
CPC ............ *G01V 3/28* (2013.01); *G01R 27/2611* (2013.01); *G01V 3/08* (2013.01); *G01V 3/10* (2013.01); *G01V 3/30* (2013.01)

(58) Field of Classification Search
CPC ......... G01R 27/2611; G01V 3/28; G01V 3/10
See application file for complete search history.

(56) References Cited

U.S. PATENT DOCUMENTS

| | | |
|---|---|---|
| 2,220,070 A | 11/1940 | Aiken |
| 2,997,645 A | 8/1961 | Huddleston, Jr. et al. |
| 3,014,177 A | 12/1961 | Hungerford et al. |
| 5,089,779 A | 2/1992 | Rorden |
| 6,573,722 B2 | 6/2003 | Rosthal et al. |
| 6,624,634 B2 | 9/2003 | Rosthal et al. |
| 6,680,613 B2 | 1/2004 | Rosthal et al. |
| 6,693,430 B2 | 2/2004 | Rosthal et al. |
| 6,710,601 B2 | 3/2004 | Rosthal et al. |

(Continued)

FOREIGN PATENT DOCUMENTS

| | | |
|---|---|---|
| AU | 2011356674 B2 | 8/2014 |
| WO | WO-2012102705 A1 | 8/2012 |

OTHER PUBLICATIONS

The Free Dictionary, definition of fixed, downloaded Oct. 3, 2013 http://www.thefreedictionary.com/fixed, pp. 1-4.*

(Continued)

*Primary Examiner* — John Breene
*Assistant Examiner* — L. Anderson
(74) *Attorney, Agent, or Firm* — Gilliam IP PLLC

(57) ABSTRACT

Various embodiments include apparatus and methods to operate an induction measurement process in a borehole that addresses direct coupling of a signal between sensors of a measuring tool. Apparatus and methods can include a processing unit to generate formation parameters from signals received in the measurement tool. Additional apparatus, systems, and methods are disclosed.

24 Claims, 14 Drawing Sheets

(56) References Cited

U.S. PATENT DOCUMENTS

| | | | |
|---|---|---|---|
| 7,026,820 | B2 | 4/2006 | Xiao et al. |
| 2003/0071626 | A1 | 4/2003 | Omeragic et al. |
| 2005/0256644 | A1 | 11/2005 | Xiao |
| 2006/0103389 | A1* | 5/2006 | Bespalov et al. ... E21B 47/0002 324/338 |
| 2006/0175057 | A1* | 8/2006 | Mandal et al. ......... E21B 47/01 166/254.2 |
| 2006/0192562 | A1 | 8/2006 | Davydychev et al. |
| 2007/0024285 | A1 | 2/2007 | Wang et al. |
| 2007/0103160 | A1 | 5/2007 | Pelegri |
| 2009/0160449 | A1 | 6/2009 | Martinez et al. |
| 2010/0231220 | A1* | 9/2010 | Alumbaugh et al. ..... E21B 7/04 324/338 |
| 2013/0141102 | A1* | 6/2013 | Donderici et al. ....... G01V 3/18 324/338 |

OTHER PUBLICATIONS

"Gulf Cooperation Council Application Serial No. 2012/20346, Office Action dated Dec. 21, 2015", 6 pgs.

"Gulf Cooperation Council Application Serial No. 2012/20346, Request for Re-examination filed Mar. 3, 2016 in response to Office Action dated Dec. 21, 2015", 7 pgs.

"International Application Serial No. PCT/US2011/022421, International Preliminary Report on Patentability dated Apr. 11, 2013", 19 pgs.

"International Application Serial No. PCT/US2011/022421, International Search Report dated Jan. 4, 2012", 7 pgs.

"International Application Serial No. PCT/US2011/022421, Invitation to Pay Additional Fees/Partial International Search dated Nov. 15, 2011", 7 pgs.

"International Application Serial No. PCT/US2011/022421, Written Opinion dated Jan. 4, 2012", 10 pgs.

"Australian Application Serial No. 2011356674, Response filed Jul. 22, 2014 to First Examination Report dated Nov. 25, 2013", 15 pgs.

"Malaysian Application Serial No. PI2013000992, Substantive Examination Report dated Jul. 15, 2016", 4 pgs.

"Australian Application Serial No. 2011356674, First Examination Report dated Nov. 25, 2013", 4 pgs.

"European Application Serial No. 11702352.3, Office Action dated Apr. 8, 2013", 2 pgs.

"European Application Serial No. 11702352.3, Response filed Oct. 3, 2013 to Office Action dated Apr. 8, 2013", 12 pgs.

"International Application Serial No. PCT/US2011/022421, Response filed Nov. 21, 2012 to Written Opinion dated Jan. 4, 2012", 9 pgs.

\* cited by examiner

DIRECT COUPLING CANCELLATION WITH A COMBINATION OF SENSOR TILT ANGLES

RELATED APPLICATIONS

This application is a U.S. National Stage Filing under 35 U.S.C. 371 from International Application No. PCT/US2011/022421, filed on 25 Jan. 2011, and published as WO 2012/102705 A1 on 2 Aug. 2012; which application and publication are incorporated herein by reference in their entirety.

TECHNICAL FIELD

The present invention relates generally to apparatus for making measurements related to oil and gas exploration.

BACKGROUND

In drilling wells for oil and gas exploration, understanding the structure and properties of the associated geological formation provides information to aid such exploration. Measurements in a borehole are typically performed to attain this understanding. Induction tools can make accurate resistivity readings of formations downhole and are an important part of well-logging. The reading of these tools is based on the induction principle in which the transmitter produces a magnetic flux, which is picked up by the receiver. Part of the flux at the receiver is coupled directly from the transmitter and does not contain any information regarding the formation. This part of the received signal is denoted as the direct coupling signal. Another part of the signal is due to conductivity of the formation acting as a secondary transformer. This part of the signal is denoted as the formation signal.

To obtain formation measurements, it is usually desirable to reduce the ratio of the direct coupling signal to the formation signal, since the direct coupling signal can saturate and contaminate the formation signal. Traditionally, an additional antenna with opposite turns, referred to as a bucking antenna, is used to cancel out the direct portion of the total signal. Since a bucking antenna pair is used for each receiver, a measurement structure including bucking antennas results in a large number of receivers, complex tool electronics, and complexity of manufacture. Further, the usefulness of such traditional measurements may be related to the precision or quality of the information derived from such measurements.

DETAILED DESCRIPTION

The following detailed description refers to the accompanying drawings that show, by way of illustration and not limitation, various embodiments in which the invention may be practiced. These embodiments are described in sufficient detail to enable those skilled in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Figure 1:
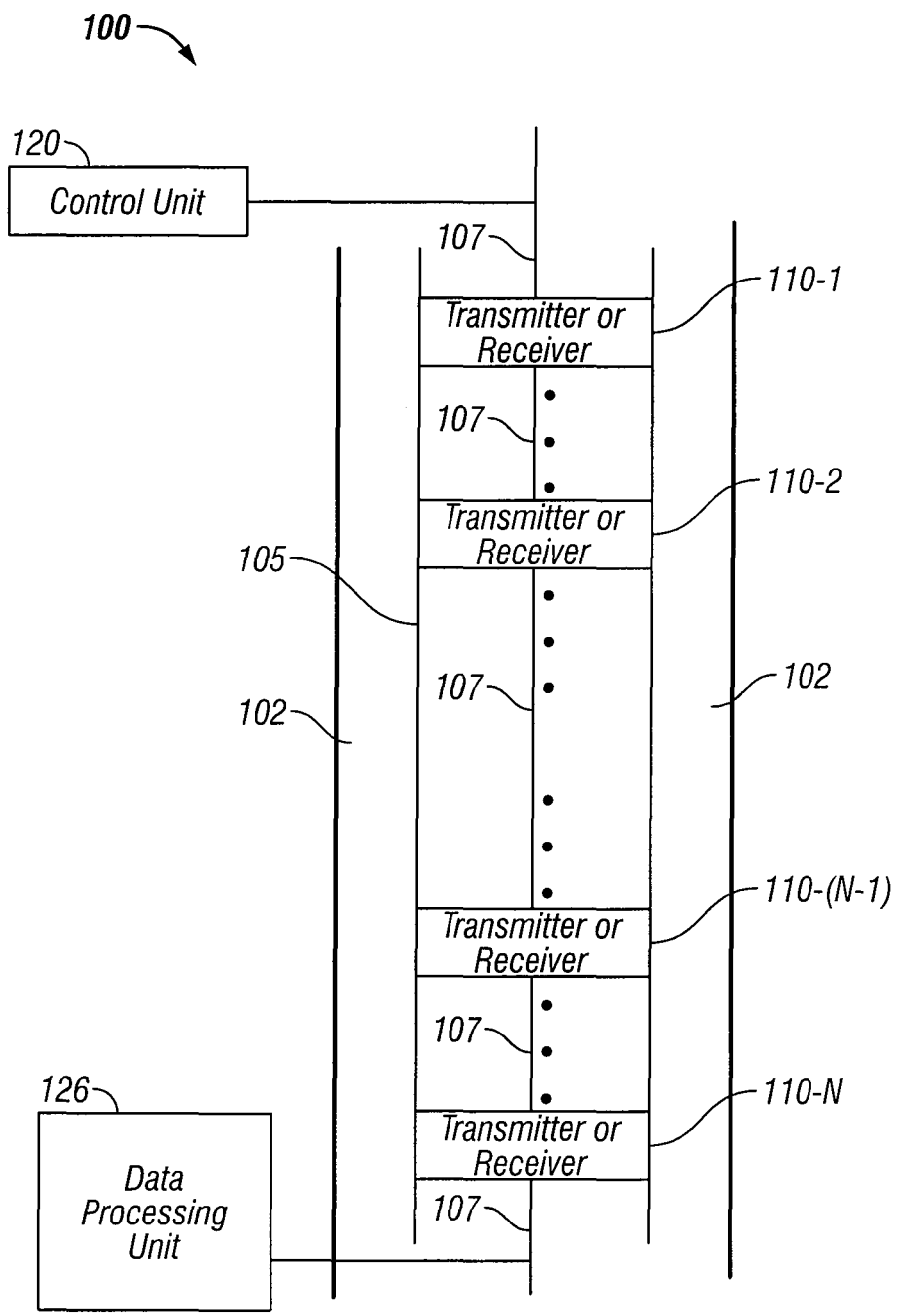
FIG. 1 shows a block diagram of an apparatus to address direct coupling in an induction measurement in a borehole, according to various embodiments.

In downhole resistivity measurements with induction tools, a received voltage from a probe signal has two main contributions. The first contribution is the direct signal due to direct coupling between the transmitting and receiving sensors. The second contribution is the formation signal due to induced currents in the formation. The induced currents are functions of the properties of the formation signal and the probe signal. At low frequencies, this formation signal has a linear relationship with respect to conductivity. As a result, it is usually favorable to operate in that regime. However, as the operating frequency is lowered, the direct coupling signal becomes increasingly dominant. At these frequencies, the direct coupling signal can contaminate and saturate the total signal, which can make measurement of the formation signal quite difficult. Traditionally, a bucking sensor can be used to address this problem from direct coupling. The bucking sensor is electrically connected to the main sensor with opposite winding; and its position and gain is adjusted such that a cancellation is achieved in the direct signal FIG. 1 shows a block diagram of an embodiment of an apparatus 100 to address direct coupling in an induction measurement in a borehole 102. Apparatus 100 includes a tool 105 that can produce cancellation in direct coupling by using tilted sensors. Tool 105 has an arrangement of sensors 110-1, 110-2 . . . 110-(N-1), 110-N along a longitudinal axis 107 of tool 105. Each sensor 110-1, 110-2 . . . 110-(N-1), 110-N can be tilted with respect to longitudinal axis 107 such that direct coupling between corresponding sensors in an induction measurement can be substantially canceled due to the tilt in each of the corresponding sensors. In a tool such as tool 105, cancellation of direct coupling can be achieved by applying a special tilt angle combination to the transmitting and receiving sensor orientations. The arrangement of sensors can include a combination of a transmitting sensor and a receiving sensor having tilt angles such that the angles correspond to angles at which a magnetic dipole of the receiving sensor is perpendicular to fields of the transmitting sensor in free space. At this tilt angle combination, the magnetic dipole of the receiving antenna is perpendicular to the direct field tangent associated with the transmitting antenna effectively cancelling out the direct field component. As a result, there is no need for an additional bucking sensor in tool 105 or other similar tool embodiments as taught herein.

The performance of tool 105 can be similar to performance of the traditional bucking tool, when compared to a traditional bucking tool of the same size. However, tool 105, or similar embodiments of a tool having arrangement of sensors to cancel direct coupling signals, can reduce the cost and complexity significantly relative to a traditional tool, since only half of the receiving antenna elements are used compared to the bucking tool. Tool 105, or similar tools in various embodiments, when compared to conventional tools, eliminates direct coupling without the additional sensor associated with a bucking sensor configuration; reduces cost and complexity of the induction system by reducing the number of receivers by half; does not produce any significant drawback in performance; produces accurate readings for a wide range of resistivity values;

provides deep and accurate evaluation of formations in both wireline applications and measurements-while-drilling (MWD) applications such as a logging-while-drilling (LWD) applications; and can be extended to anisotropic measurements.

In various embodiments, in the arrangement of sensors 110-1, 110-2 . . . 110-(N-1), 110-N, a tilt angle of a transmitting sensor can be different from the tilt angle of a corresponding receiving sensor in which a received signal is acquired such that direct coupling is substantially cancelled. Alternatively, the tilt angle of a transmitting sensor can be the same as the tilt angle of a corresponding receiving sensor in which a received signal is acquired such that direct coupling is substantially cancelled. Sensors 110-1, 110-2 . . . 110-(N-1), 110-N of tool 105 can include a plurality of transmitting antennas and receiving antennas to provide images with different depth and resolution.

Apparatus 100 can include a control unit 120 that manages the generation of transmission signals and the collection of received signals corresponding to the transmission signals. The generation of transmission signals can be conducted to provide signals of different frequencies. Each of the different frequencies can be associated with a different transmitting sensor. The collected received signals can be provided to a data processing unit 126 in appropriate format to perform numerical inversion on data generated from signals acquired at receiving antennas in the arrangement of sensors 110-1, 110-2 . . . 110-(N-1), 110-N.

Data processing unit 126 can be structured to have a signal library to perform the numerical inversion on data generated from signals acquired at receiving antennas. Data processing unit can be structured to include a borehole correction library to provide borehole correction prior to using a signal library to perform the numerical inversion, where the signal library may be absent borehole parameters. Data processing unit 126 can be structured to operable to provide layer properties and/or borehole properties using patterning matching and/or iterative processing. Data processing unit 126 can be arranged as a separate unit from control unit 120 or integrated with control unit 120.

Figure 2:
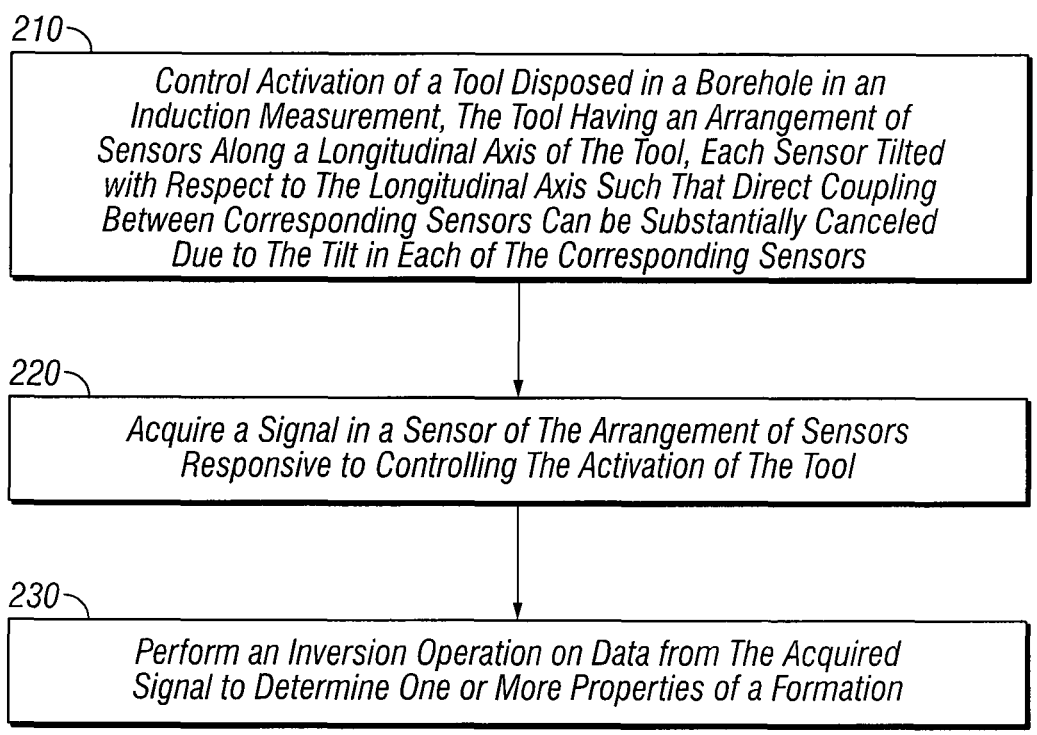
FIG. 2 shows features of an example method to measure properties of a formation, according to various embodiments.

FIG. 2 shows features of an embodiment of an example method to measure properties of a formation, according to various embodiments. At 210, activation of a tool disposed in the borehole is controlled in an induction measurement, where the tool has an arrangement of sensors along a longitudinal axis of the tool. Each sensor is tilted with respect to the longitudinal axis such that direct coupling between corresponding sensors can be substantially canceled due to the tilt in each of the corresponding sensors. Controlling the activation of the tool can include transmitting signals at multiple frequencies at the same time.

In various embodiments, calibrating activities can be conducted to construct the sensor configurations, which can include determining tilt angles for a receiver antenna and a corresponding transmitter antenna in the arrangement of sensors such the receiver antenna and the corresponding transmitter antenna are tilted with respect to the longitudinal axis to substantially cancel direct coupling between the receiver antenna and the corresponding transmitter antenna. Determining tilt angles can include performing simulations taking into account distance between the receiver antenna and the corresponding transmitter antenna or physically increasing or decreasing the respective tilt angle until zero direct coupling is observed.

At 220, a signal is acquired in a sensor of the arrangement of sensors, where the signal occurs responsive to controlling the activation of the tool. With control of the activation of the tool realized by generating one or more transmission signals and applying the one or more transmission signals to one or more transmitting antennas in the arrangement of sensors, the acquisition of the signal from controlling the activation of the tool can be realized by acquiring one or more received signals at one or more receiving antennas of the arrangement of sensors, where the one or more received signals correspond to the one or more transmission signals such that the received signals are substantially without a direct coupling signal between receiver antennas and corresponding transmitting antennas oriented at tilt angles to substantially cancel the direct coupling signal. The one or more transmission signals can be generated within a frequency range of 100 Hz to 10 MHz.

The tool can be rotated and data can be collected from different azimuthal angles during the rotation. In addition, a drilling operation can be stopped while making measurements. This stoppage can be made to reduce noise in the data generated from the measurements.

At 230, an inversion operation on data from the acquired signal is performed to determine one or more properties of a formation. Performing the inversion operation can include matching the data to patterns in a signal library or using an iterative solver coupled with forward model. Alternatively, performing the inversion operation can include making a borehole correction to the data using a borehole correction module to generate borehole corrected data, and matching the borehole corrected data to patterns in a signal library to provide one or more properties of a formation or using an iterative solver coupled with forward model on the borehole corrected data to provide one or more properties of a formation. Additionally, one or more borehole properties determined as an output of an inversion process on signal data can be provided as inputs to making a borehole correction to refine existing borehole parameters. The various activities discussed with respect to the features of FIG. 2 may be performed in various embodiments associated with the apparatus discussed herein.

Figure 3:
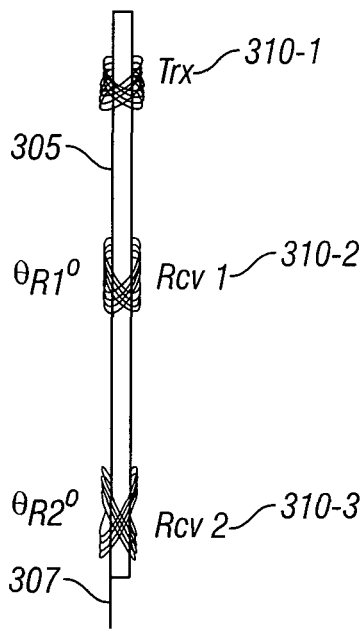
FIG. 3 shows an embodiment of a tool having an arrangement of a transmitter antenna and receiver antennas tilted with respect to the longitudinal axis of the tool, according to various embodiments.

FIG. 3 shows an embodiment of a tool 305 having an arrangement of a transmitter antenna 310-1 and receiver antennas 310-2 and 310-3 tilted with respect to the longitudinal axis 307 of tool 305. Cancellation of direct coupling between transmitter antenna 310-1 and receiver antenna 310-2 and between transmitter antenna 310-1 and receiver antenna 310-3 can be achieved by applying a special tilt angle combination to the respective transmitting and receiving sensor orientations. At this tilt angle combination, magnetic dipole of the receiving antenna is perpendicular to the direct field tangent associated with the transmitting antenna effectively cancelling out the direct field component. Multiple antennas facing different azimuth orientation can be used to collect azimuthal information. Each antenna in an antenna array can be at a different specific angle that cancels the direct field component. With transmitter antenna 310-1 of tool 305 configured, receiver antenna 310-2 can be attached at tilt angle $\theta_{R1}$ to achieve direct coupling cancellation with respect to transmitter antenna 310-1 and receiver antenna 310-3 can be attached at tilt angle $\theta_{R2}$ to achieve direct coupling cancellation with respect to transmitter antenna 310-1. The appropriate tilt angle to achieve direct coupling cancellation may depend on distance of a receiver to corresponding transmitter.

Figure 4:
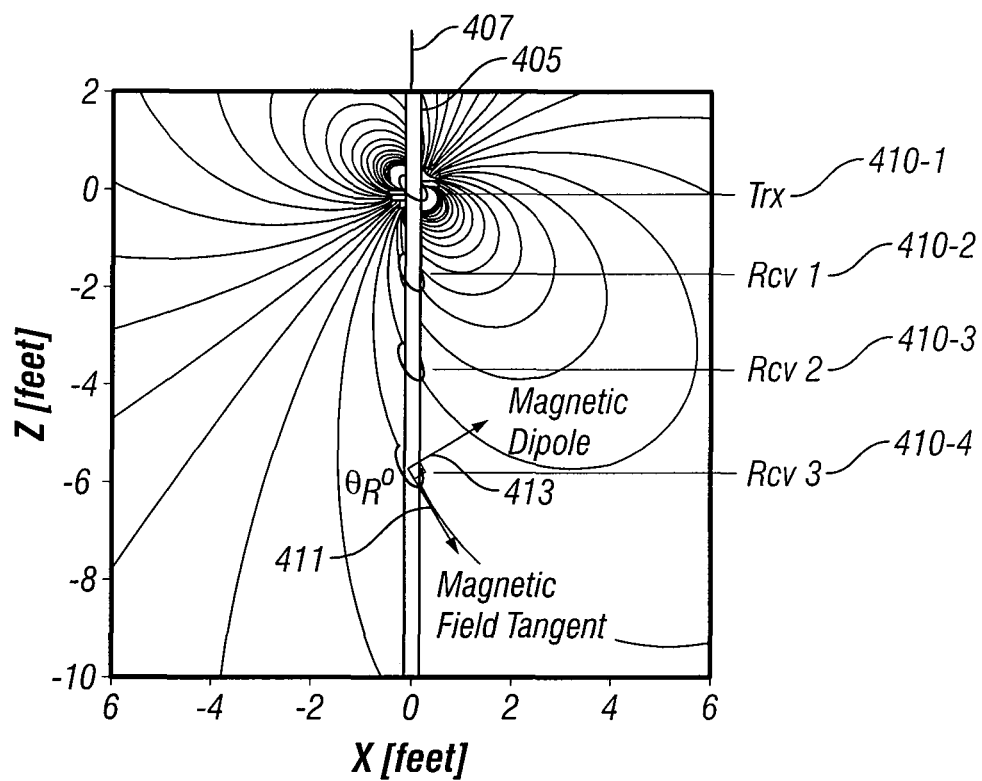
FIG. 4 shows an embodiment of a tool with respect to magnetic field lines, according to various embodiments.

FIG. 4 shows an embodiment of a tool 405 with respect to magnetic field lines. Tool 405 has an arrangement of a transmitter antenna 410-1 and receiver antennas 410-2, 410-3, and 410-4 tilted with respect to the longitudinal axis 407 of tool 405. The magnetic fields line associated with operating transmitter antenna 410-1 are shown at various distances from transmitter antenna 410-1. As an example, receiver antenna 410-4 is shown disposed in tool 405 at a distance of −6 feet from transmitter antenna 410-1, that is, 6 feet below transmitter antenna 410-1 with longitudinal axis 407 arranged vertically in the shown coordinate system. Receiver antenna 410-4 is adjusted to a tilt angle of $\theta_R$ degrees relative to longitudinal axis 407 such that magnetic dipole 413 is perpendicular to magnetic field tangent 411. Depending on the magnetic field lines from transmitter antenna 410-1, tilt angle $\theta_R$ of receiver antenna 410-4 may vary at different distances along tool 405 from transmitter antenna 410-1. The tilt angles associated with receiver antennas 410-2 and 410-3, to cancel direct coupling, may vary from tilt angle $\theta_R$ of receiver antenna 410-4 depending on their respective distance from transmitter antenna 410-1. Alternatively, the tilt angles of receiver antennas 410-2 and 410-3 may be adjusted to cancel direct coupling with transmitter antennas along tool 405 other than transmitter antenna 410-1 (not shown to focus on the discussed characteristics of the tilt angle of receiver antenna 410-4), where such adjustment can also depend on distance from their corresponding transmitter antennas.

Collection of signals having direct coupling cancellation in an array of transmitter 410-1 and receiver antennas 410-2, 410-3, and 410-4, or other array arrangements, can be controlled to acquire and appropriately store such measurements by controlling the activation and signal collection at transmitters and corresponding receivers having the respective tilt angle combination for the direct coupling cancellation. Transmitter/receiver arrangements are not limited to the number of transmitter antenna and receiver antennas at the distances shown in FIG. 4. Other arrangements having a different number of transmitter antennas and receiver antennas separated by various distances can be used.

Figure 5:
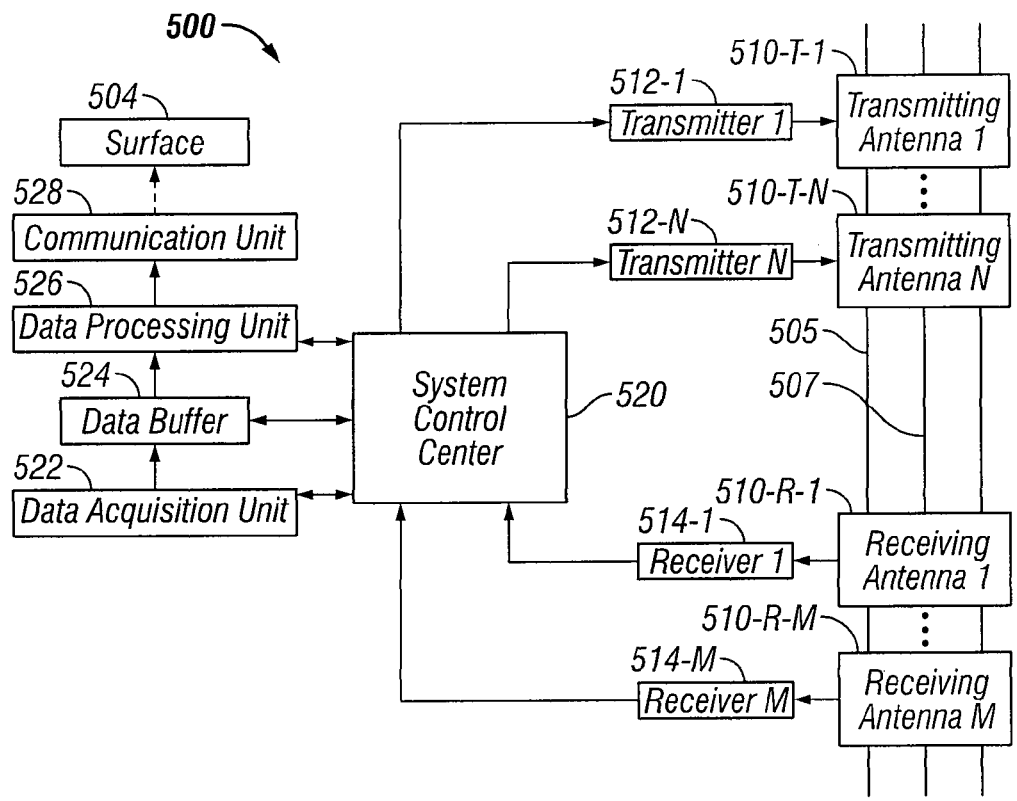
FIG. 5 shows a block diagram of an embodiment of an apparatus having a tool with transmitting antennas and receiving antennas having a specific orientation relative to each other, according to various embodiments.

FIG. 5 shows a block diagram of an embodiment of an apparatus 500, having a tool 505 with transmitting antennas 510-T-1 . . . 510-T-N and receiving antennas 510-R-1 . . . 510-R-M, to determine properties of a formation with respect to a borehole in which tool 505 is placed. Transmitting antennas 510-T-1 . . . 510-T-N and receiving antennas 510-R-1 . . . 510-R-M can be configured along tool 505 such that each has a tilt angle with respect to longitudinal axis 507 of tool 505. At least one combination of a transmitting antenna 510-T-I (1≤I≤N) and a receiving antenna 510-R-J (1≤J≤M) is arranged with tilt angles such that direct coupling between transmitting antenna 510-T-I and a receiving antenna 510-R-J is cancelled. The tilt angles of transmitting antenna 510-T-I and receiving antenna 510-R-J can be different.

Apparatus 500 can include a system control center 520, transmitters 512-1 . . . 510-N, receivers 514-1 . . . 514-M, a data acquisition unit 522, a data buffer 524, a data processing unit 526, and a communication unit 528 in addition to tool 505 with transmitting antennas 510-T-1 . . . 510-T-N and receiving antennas 510-R-1 . . . 510-R-M. System control center 520 can include a central processing unit (CPU), analog electronics, or various combinations thereof to manage operation of other units of apparatus 500. System control center 520 can generate a signal and feed the signal to transmitters 512-1 . . . 512-N. The signal can be generated within a frequency in range 100 Hz to 10 MHz. Other frequency ranges may be used. Transmitters 512-1 . . . 512-N direct currents to transmitting antennas 510-T-1 . . . 510-T-N, which emit electromagnetic waves into the formation. Although tool 505 is operable to achieve direct coupling elimination with a single transmitting antenna, multiple transmitting antennas can be used to gather additional data to improve sensing of formation parameters. For example, transmitting antennas at different distance to the receiving antennas may produce images with different depth and resolution. As another example, antennas with different tilt angles or orientations may be used to produce sensitivity to anisotropic formation parameters.

Electromagnetic wave signals that are received at receiving antennas 510-R-1 . . . 510-R-M are directed to corresponding receivers 514-1 . . . 514-M and system control center 520. Operation of apparatus 500 can include multiple frequencies being transmitted and received at the same time for better time utilization. In such an operation, a square waveform or other time waveforms may be used to excite multiple frequencies simultaneously at each transmitting antenna 510-T-1 . . . 510-T-M or individual frequencies at transmitter antennas 510-T-1 . . . 510-T-M. Received signals corresponding to the multiple frequencies can be separated by filters at the receiving end in data acquisition unit 522. For each transmitting antenna 510-T-1 . . . 510-T-M, received signals at all receivers 514-1 . . . 514-M can be recorded. Data buffer 524 can be used to store received signal for processing.

Data processing unit 526 can be used to perform processing or inversion on the data. Inversion operations can include a comparison of measurements to predictions of a model such that a value or spatial variation of a physical property can be determined. A conventional inversion operation can include determining a variation of electrical conductivity in a formation from measurements of induced electric and magnetic fields. Other techniques, such as a forward model, deal with calculating expected observed values with respect to an assumed model. In various embodiments, an inversion process, conducted with respect to apparatus 500, may be performed downhole or in an analysis unit, such as a computer, at surface 504 after the data is transferred to surface 504. Communication unit 528 can communicate the data or results to surface 504 for observation and/or determination of subsequent action to be taken in a drilling operation related to the measurements taken with apparatus 500. The data or results may also be communicated to other tools downhole and used to improve various aspects of locating and extracting hydrocarbons.

Figure 6:
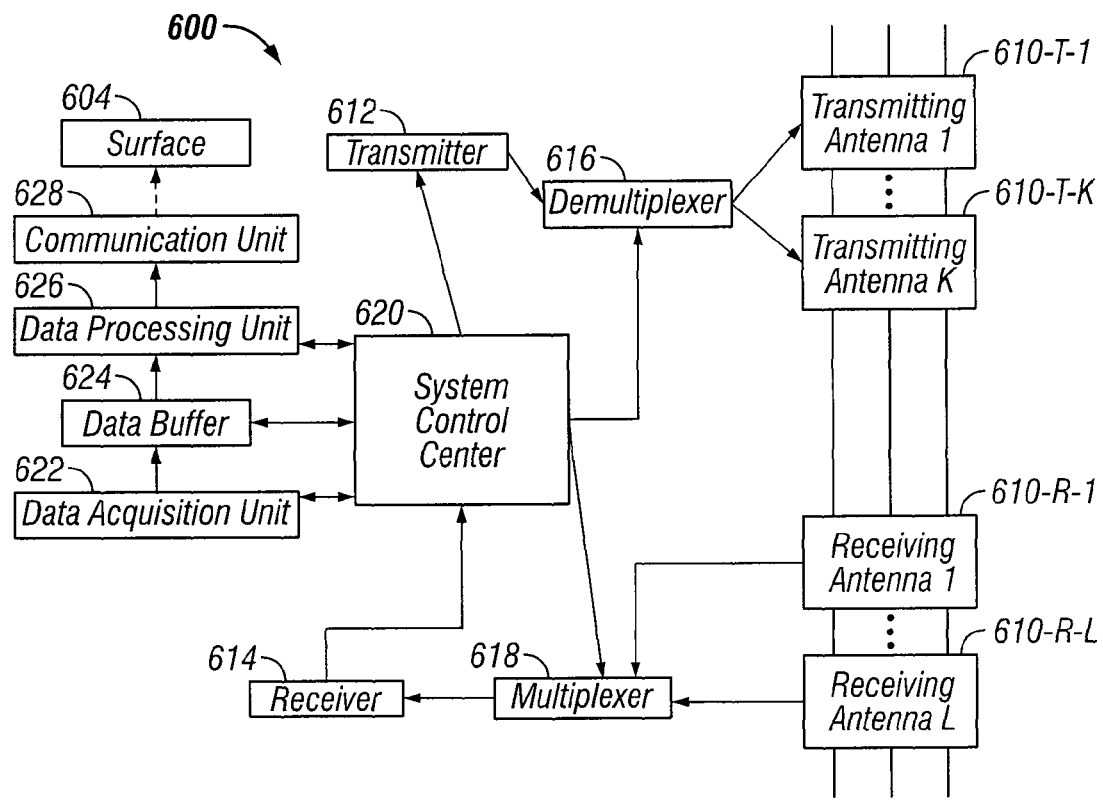
FIG. 6 shows a block diagram of an embodiment of an apparatus having a tool with transmitting antennas and receiving antennas having a specific orientation relative to each other, according to various embodiments.

FIG. 6 shows a block diagram of an embodiment of an apparatus 600 having a tool 605 with transmitting antennas 610-T-1 . . . 610-T-K and receiving antennas 510-R-1 . . . 510-R-L to determine properties of a formation with respect to the borehole in which tool 605 is placed. Transmitting antennas 610-T-1 . . . 610-T-K and receiving antennas 510-R-1 . . . 510-R-L can be configured along tool 605 such that each has a tilt angle with respect to longitudinal axis 607 of tool 605. At least one combination of a transmitting antenna 610-T-I (1≤I≤K) and a receiving antenna 610-R-J (1≤J≤L) is arranged with tilt angles such that direct coupling between transmitting antenna 610-T-I and a receiving antenna 610-R-J is cancelled. The tilt angles of transmitting antenna 610-T-I and receiving antenna 610-R-J can be different.

Apparatus 600 can include a system control center 620, a transmitter 612, a demultiplexer 616, a receiver 614, a multiplexer 618, a data acquisition unit 622, a data buffer 624, a data processing unit 626, and a communication unit 628 in addition to tool 605 with transmitting antennas 610-T-1 . . . 610-T-K and receiving antennas 510-R-1 . . . 510-R-L. System control center 620 can include a central processing unit (CPU), analog electronics, or various combinations thereof to manage operation of other units of apparatus 600. System control center 620 can generate one or more signals and feed the one or more signals to transmitter 612. Multiple transmitting antennas 610-T-1 . . . 610-T-K may be connected to single transmitter 612 via demultiplexer 616 that is controlled via system control center 620. Demultiplexer 616 can be realized as a device that has a single input and multiple outputs such that a signal or signals to the input of the single input can be distributed appropriately to the multiple outputs of the demultiplexer to be sent to multiple devices. Alternatively, a demultiplexer may have M inputs and N outputs where N≥M, N and M being positive integers. As an example, demultiplexer 616 can be realized as a switch controlled by system control center 620 that selects which of transmitting antennas 610-T-1 . . . 610-T-K receives a particular signal being generated. Transmitter 612 and demultiplexer 616 can be realized as a single integrated unit. Use of demultiplexer 616 may reduce the total number of transmitters, size of electronics, and complexity of apparatus 600.

A signal or signals can be generated from system control center within a frequency in range 100 Hz to 10 MHz. Other frequency ranges may be used. Transmitter 612 directs currents to transmitting antennas transmitting antennas 610-T-1 . . . 610-T-K, which emit electromagnetic waves into the formation. Multiple transmitting antennas of tool 605 can be used to gather additional data to improve sensing of formation parameters, although tool 605 is operable to achieve direct coupling elimination with a single transmitting antenna. For example, transmitting antennas at different distance to the receiving antennas may produce images with different depth and resolution. As another example, antennas with different tilt angles or orientations may be used to produce sensitivity to anisotropic formation parameters.

Electromagnetic wave signals that are received at receiving antennas 510-R-1 . . . 510-R-L are directed to receiver 614 and system control center 620 via multiplexer 618 that is controlled via system control center 620. Demultiplexer 616 can be realized as a device that has multiple inputs and a single output such that a signal or signals to the multiple inputs can be directed appropriately to the single output of the multiplexer to be sent to a single device. Alternatively, a multiplexer may have M inputs and N outputs where M≥N, N and M being positive integers. As an example, multiplexer 618 can be realized as a switch controlled by system control center 620 that selects which received signal of receiving antennas 510-R-1 . . . 510-R-L is directed to being acquired by apparatus 600 at a particular time. Receiver 614 and multiplexer 618 can be realized as a single integrated unit. Use of multiplexer 618 can provide efficacy and may reduce the total number of receivers, size of electronics, and complexity of apparatus 600.

Operation of apparatus 600 can include multiple frequencies being transmitted and received at the same time for better time utilization. In such an operation, a square waveform or other time waveforms may be used to excite multiple frequencies simultaneously at each transmitter antenna 610-T-1 . . . 610-T-K or individual frequencies at transmitter antennas 610-T-1 . . . 610-T-K. Received signals corresponding to the multiple frequencies can be separated by filters at the receiving end in data acquisition unit 622. For each transmitting antenna 610-T-1 . . . 610-T-K, received signals at all receivers 614-1 . . . 614-L can be recorded. Data buffer 624 can be used to store received signal for processing.

Data processing unit 626 can be used to perform processing or inversion on the data. Inversion operations can include a comparison of measurements to predictions of a model such that a value or spatial variation of a physical property can be determined. A conventional inversion operation can include determining a variation of electrical conductivity in a formation from measurements of induced electric and magnetic fields. Other techniques, such as a forward model, deal with calculating expected observed values with respect to an assumed model. In various embodiments, an inversion process, conducted with respect to apparatus 600, may be performed downhole or in an analysis unit, such as a computer, at surface 604 after the data is transferred to surface 604. Communication unit 628 can communicate the data or results to surface for observation 604 and/or determination of subsequent action to be taken in a drilling operation related to the measurements taken with apparatus 600. The data or results may also be communicated to other tools downhole and used to improve various aspects of locating and extracting hydrocarbons.

In various embodiments, arrangements of sensors as taught herein can include the use of a variety of sensors. For example, both transmitting sensors and receiving sensors can be of an induction type. Such sensors can be realized as one of a coil, a solenoid, a magnetometer, or other similar sensor. In order to achieve cancellation of direct coupling, both transmitting and receiving sensors are placed in the tool with a special tilt angle. This special angle can be selected to correspond to the angle at which the magnetic dipole of the receiving sensor is perpendicular to the fields of the transmitting sensor in free space as shown in FIG. 4 for example. This special angle may either be computed via computer simulations, or it may be experimentally obtained by manually increasing or decreasing the tilt angle of the receiving sensor, the transmitting sensor, or both the receiving sensor and the transmitting sensor until zero direct coupling is observed. This angle may in general be different for transmitting and receiving antennas. However, it may also be made the same.

In case of coil sensors, a tilt angle may be produced by winding the coil with an angle. In case of a solenoid, the elevation angle of the core may be adjusted for the desired tilt angle. In case of a magnetometer, the device may be mounted onto or into the tool with the desired tilt angle. In LWD applications, a tilted coil approach may provide for enhanced mode of operation relative to the other types of sensors, due to mechanical problems associated with the other antenna types. In wireline applications, a main consideration includes electrical performance of a particular sensor rather than a mechanical property associated with the particular sensor.

To enhance processing of data collected by the various types of sensors, drilling may be stopped while making measurements to reduce noise in the data. In addition, tool rotation may be utilized to collect binned data from different azimuth angles (consider cylindrical coordinates with respect to the longitudinal axis of the tool). Multiple antennas facing different azimuth orientation may be used to collect azimuthal information. Each antenna in an antenna array can be adjusted to be at a different specific angle that cancels the direct field component associated with the respective antenna. With the cancellation of direct coupling based on tilt angles relative to corresponding transmitting and receiving sensors of a tool, the performance of such a tool may be sensitive to variations on the tilt angle of the corresponding sensors. As a result, maintaining the correct angle is appropriate to obtain accurate results. The amount of allowable variation from the correct angle depends on the particular application. Noise due to vibrations in the tool due to drilling, or tool bend due to steering, can be taken into account and corrected in a post-processing scheme. In addition, a time-average can be used in data acquisition to reduce effects of vibration. In various embodiments, to provide additional data for evaluation of a formation, a tool can also contain sensors that do not achieve direct coupling elimination, where these additional sensors include tilted sensors and/or non-tilted sensors to measure signals from formations.

Data collected using tools such as tools 105, 205, 305, 405, 505, 605, and other similar or identical tools can be processed using inversion techniques to generate properties of a formation with respect to the borehole in which these tools are operably deployed. Performing an inversion operation or inversion operations can include using a forward model and/or a library. A forward model provides a set of mathematical relationships for sensor response that can be applied to determining what a selected sensor would measure in a particular environment, which may include a particular formation. A library can include information regarding various formation properties that can be correlated to measured responses to selected probe signals. Performing an inversion operation or inversion operations can include performing an iterative process or performing a pattern matching process.

Figure 7:
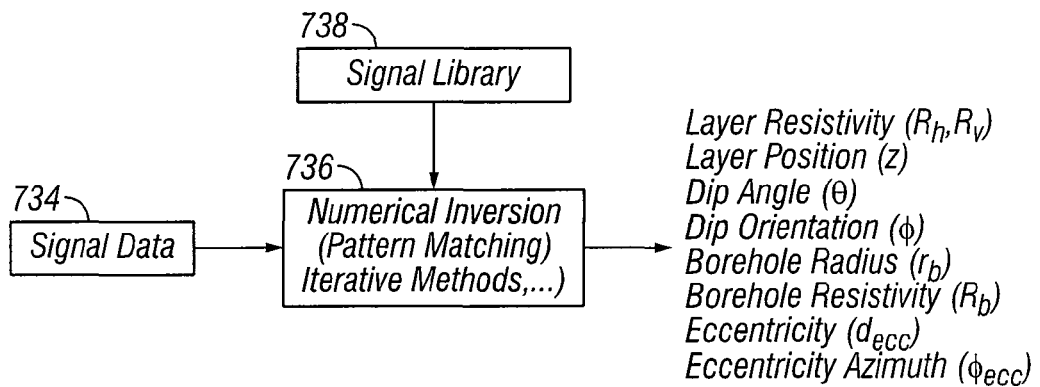
FIG. 7 shows an embodiment of elements to process data generated from operating a tool having transmitting sensors and receiving sensors having a specific orientation relative to each other, according to various embodiments.

FIG. 7 shows an example embodiment of elements to process data generated from operating a tool having transmitting sensors and receiving sensors having a specific orientation relative to each other. The specific orientation can be selected to minimize direct coupling between a transmitter sensor and a receiver sensor of a selected combination of transmitter sensor and receiver sensor. Such minimization can include substantial cancellation of a direct coupling signal or elimination of direct coupling of such a signal in operating the selected combination of transmitter sensor and receiver sensor.

Signal data 734 obtained from the tool is used in numerical inversion 736 to produce properties associated with a borehole and formation. The associated properties can include, among others, layer resistivity (horizontal: $R_h$, vertical: $R_v$), layer position d, dip angle $\theta$, dip orientation $\phi$, borehole radius $r_b$, borehole resistivity $R_b$, eccentricity $d_{ecc}$, and eccentricity azimuth $\phi_{ecc}$ parameters. Inversion 736 can be performed by matching signal data 734 to patterns in a pre-compiled signal library 738. Inversion 736 can also be performed by using an iterative solver coupled with a forward model. In inversion of a large number of layers, iterative methods may generally be more efficient. Iterative method may be the appropriate inversion procedure in inversion of a large number of layers in situations where a good initial guess on borehole parameters is not available. Additionally, signal library 734 can be used in an iterative method as an initial step to help convergence of results.

Figure 8:
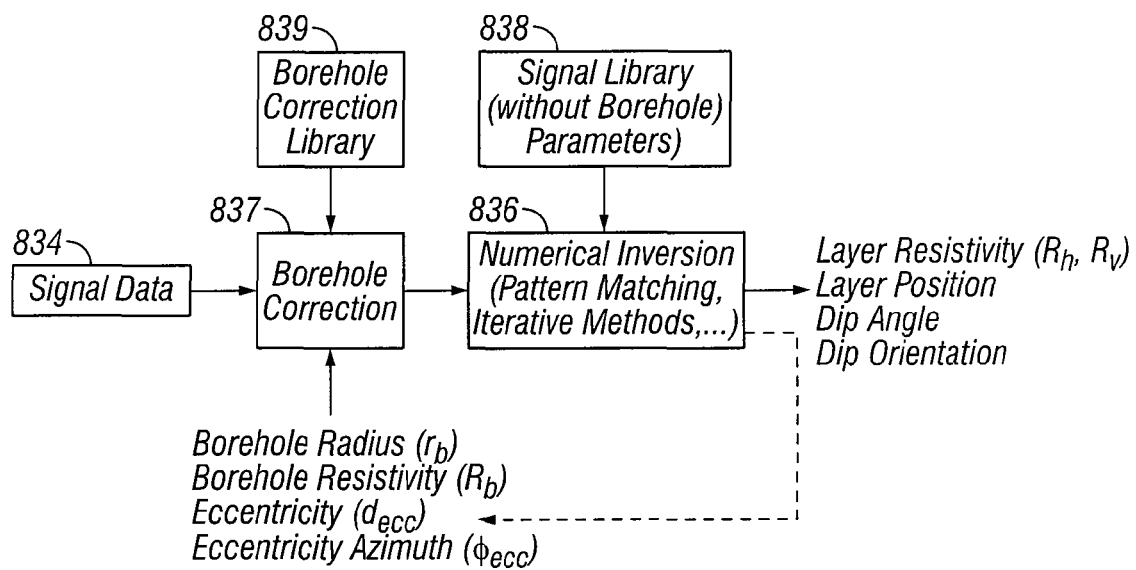
FIG. 8 shows an embodiment of elements to process data generated from operating a tool having transmitting sensors and receiving sensors having a specific orientation relative to each other, according to various embodiments.

FIG. 8 shows another example embodiment of elements to process data generated from operating a tool having transmitting sensors and receiving sensors having a specific orientation relative to each other. The specific orientation can be selected to minimize direct coupling between a transmitter sensor and a receiver sensor of a selected combination of transmitter sensor and receiver sensor. Such minimization can include substantial cancellation of a direct coupling signal or elimination of direct coupling of such a signal in operating the selected combination of transmitter sensor and receiver sensor. In this example embodiment, borehole corrects can be made prior to conducting an inversion procedure.

The example data processing illustrated in FIG. 8 may provide a more efficient approach, than the approach of FIG. 7, when it can be assumed that borehole effects can be decoupled from shoulder effects and a separate borehole correction procedure can be utilized as shown in FIG. 8. Shoulder effects may arise when a formation signal includes contributions from interface regions between formation layers. Signal data 834 obtained from the tool is operated on to conduct borehole correction 837. Borehole correction 837 can be conducted using a borehole correction library 839. Borehole correction 837 may be realized as a borehole correction module of an apparatus or system. Signal data 834 modified by borehole correction 837 can be input to inversion 836. Inversion 836 can use signal library 838 to provide layer resistivity (horizontal: $R_h$, vertical: $R_v$), layer position d, dip angle θ, dip orientation φ, along with borehole radius $r_b$, borehole resistivity $R_b$, eccentricity $d_{ecc}$, and eccentricity azimuth $φ_{ecc}$ parameters. Signal library 837 may be configured with data without borehole parameters. Inversion 836 can apply pattern matching, iterative processing, combinations thereof, or other appropriate mechanisms to generate formation parameters and/or borehole parameters. Inversion 836 of layer parameters can be carried out independently of borehole parameters based on borehole correction that uses a good solution or guess being available for borehole parameters. Further, the architectural scheme illustrated in FIG. 8 can also be used to refine an existing set of borehole parameters, such as borehole radius $r_b$, borehole resistivity $R_b$, eccentricity $d_{ecc}$, and eccentricity azimuth $φ_{ecc}$, parameters provided as outputs from inversion 836.

In various embodiments as discussed herein, tools and methods of operating the tools utilize tilted sensors to eliminate direct coupling in induction measurement. This elimination can be achieved by applying a special tilt angle combination to the transmitter and receiver employed. The tilt angles can be adjusted such that the induced magnetic field due to transmitter at the receiver location is perpendicular to that of the magnetic dipole associated with the receiver in free-space. This orientation can allow perfect cancellation of the direct field coupling. As opposed to traditional tools used to address direct field coupling, tools identical to or similar to the tools of the embodiments herein, do not require a bucking pair for each sensor. As a result, the total number of receivers used for measurement and to address direct field coupling, can be cut in half, which leads to significant reductions in complexity and cost of electronics. Performance of the tools, in accordance with various embodiments, can be similar to traditional tools based on application of a bucking sensor without any significant drawback. In various embodiments, due to eliminated direct coupling, tools with sensors oriented at the corresponding special angles can be operated at relatively low frequencies, which leads to a wide range of operation for the resistivity measurement in a borehole. Such tools also allow deep and accurate evaluation of formation layers. Further, signals from multiple tilted transmitters and receivers in combinations to operate with minimized direct coupling, such as direct coupling elimination, in each combination may be combined to make an anisotropic measurement.

Figure 9:
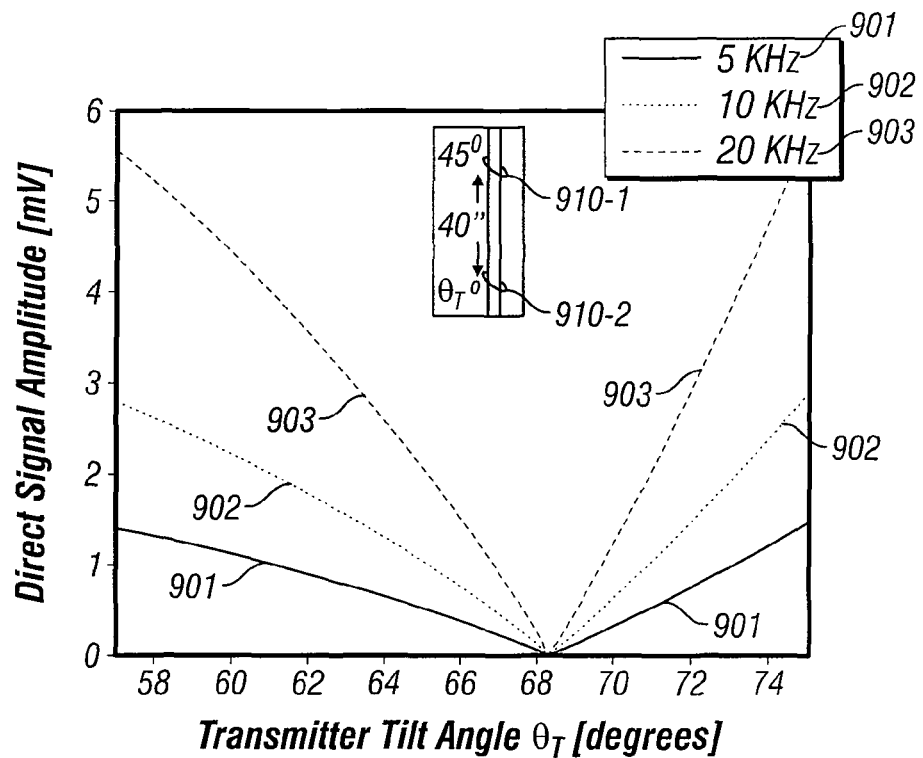
FIG. 9 shows tilt angle for a transmitter and receiver arrangement that eliminates direct coupling without an additional sensor, in accordance with various embodiments.

FIG. 9 shows a tilt angle for an arrangement of transmitter 910-2 and receiver 910-1 that eliminates direct coupling without an additional sensor, in accordance with various embodiments. In FIG. 9, the direct signal amplitude with respect to transmitter tilt angle for a receiver tilt angle set at $θ_R=45°$ is shown for three different frequencies and a transmitter-receiver spacing of 40 inches. Curve 901 shows the direct signal amplitude as a function of transmitter tilt angle at 5 kHz. Curve 902 shows the direct signal amplitude as a function of transmitter tilt angle at 10 kHz. Curve 903 shows the direct signal amplitude as a function of transmitter tilt angle at 20 kHz. The azimuthal angle is assumed to be the same for the transmitter and the receiver for simplicity. This assumption is also used in the discussion of the examples that follow. However, it should be noted here that similar conclusions, with respect to the shown data, may be drawn for cases where the azimuth angle (tilt orientation) are different. It can be seen from FIG. 9 that at around $θ_T=68.3°$ for the transmitter, the direct signal is eliminated for receiver tilt angle set at $θ_R=45°$. It can also be seen that the value of this special angle does not depend significantly on the frequency.

Figure 10:
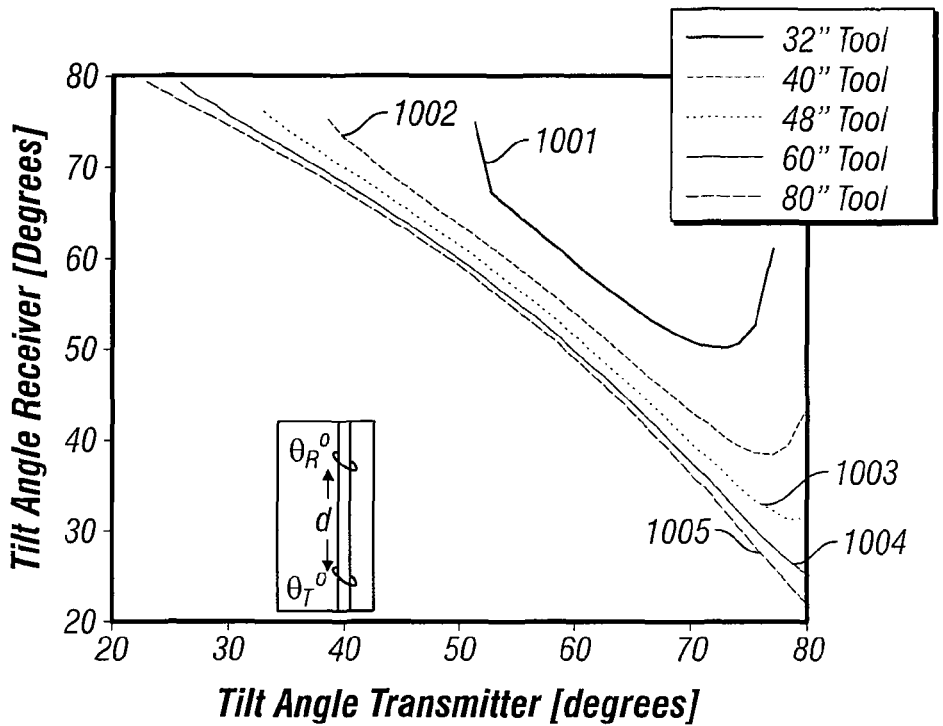
FIG. 10 shows receiver tilt angles as a function of transmitter tilt angles at which elimination of direct signal coupling occurs without an additional sensor, in accordance with various embodiments.

FIG. 10 shows receiver tilt angles as a function of transmitter tilt angles at which elimination of direct signal coupling occurs without an additional sensor, in accordance with various embodiments. FIG. 10 illustrates the angle combinations at which elimination of direct signal occurs for different transmitter—receiver tool spacings at f=10 KHz operating frequency. Curve 1001 shows the angle combinations at a transmitter—receiver spacing of 32 inches. Curve 1002 shows the angle combinations at a transmitter—receiver spacing of 40 inches. Curve 1003 shows the angle combinations at a transmitter—receiver spacing of 48 inches. Curve 1004 shows the angle combinations at a transmitter—receiver spacing of 60 inches. Curve 1005 shows the angle combinations at a transmitter—receiver spacing of 80 inches. The azimuthal angle is again assumed to be the same for the transmitter and the receiver for simplicity. It can be seen from FIG. 10 that, for direct signal elimination, there is only one possible receiver tilt angle for each transmitter angle. Moreover, in general, as the separation between the transmitter and receiver is decreased, use of higher tilt angles results. FIG. 10 also shows that the same angle may be chosen for transmitter and receiver tilt. For example, for a spacing of 80 inches, both angles may be approximately $θ_R=θ_T=54.68°$ for direct field elimination in this example.

Figure 11:
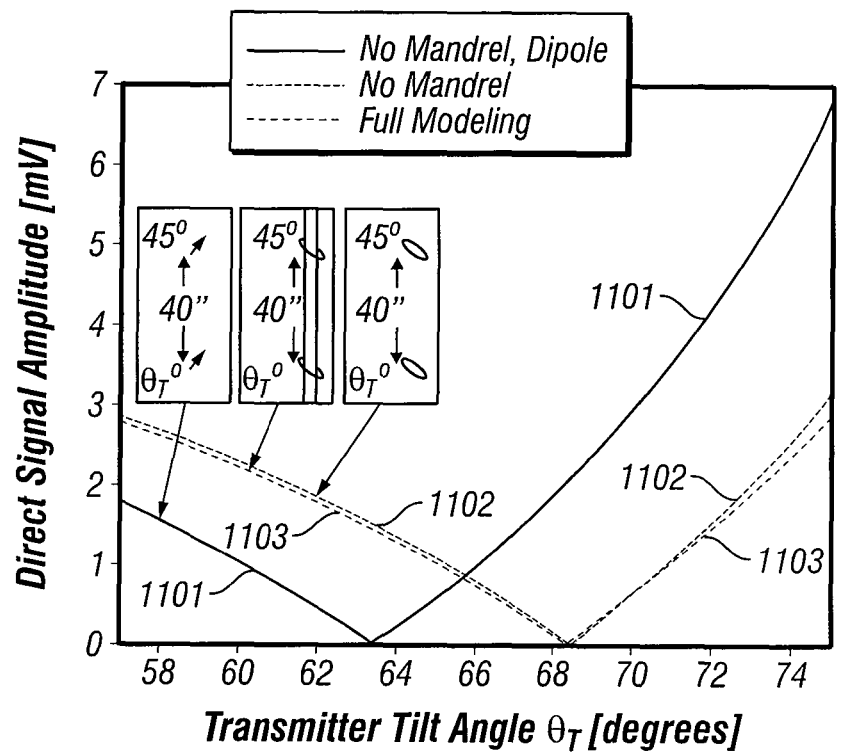
FIG. 11 shows the effect of sensor shape and presence of a perfect electric conductor pipe on direct signal elimination for a transmitter—receiver spacing of 40 inches, in accordance with various embodiments.

FIG. 11 shows the effect of sensor shape and presence of a perfect electric conductor pipe on direct signal elimination for a transmitter—receiver spacing of 40 inches, in accordance with various embodiments. The effect of sensor shape and presence of the perfect electric conductor (PEC) pipe on direct signal elimination is shown for operation at frequency f=10 KHz, pipe radius $r_{pipe}=4$ inches, and a transmitter coil radius $r_{TR}=4.5$ inches. The coil radius is measured from its projection onto the plane transversal to the pipe axis. Curve 1101 shows the direct signal amplitude as a function of transmitter tilt angle modeled without sensors and mandrel, i.e. no PEC pipe, considering a dipole separated by 40 inches. Curve 1102 shows the direct signal amplitude as a function of transmitter tilt angle modeled for sensors with no mandrel and sensor separation of 40 inches. Curve 1103 shows the direct signal amplitude as a function of transmitter tilt angle for full modeling with transmitting and receiving sensors tilted on a mandrel with sensor separation of 40 inches. The azimuthal angle is again assumed to be the same for the transmitter and the receiver for simplicity. FIG. 11 illustrates that both coil shape and presence of pipe have significant effect on the transmitter angle at which the elimination occurs. As a result, these effects can be taken into consideration in determining the tilt angles of the sensors.

Figure 12:
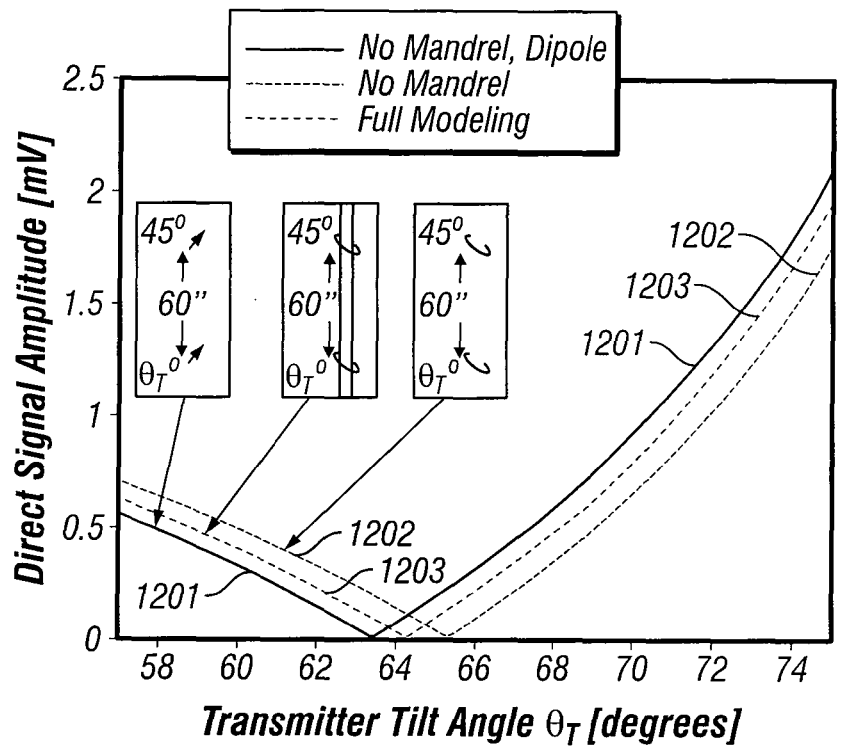
FIG. 12 shows the effect of sensor shape and presence of a perfect electric conductor pipe on direct signal elimination for a transmitter—receiver spacing of 60 inches, in accordance with various embodiments.

FIG. 12 shows the effect of sensor shape and presence of a perfect electric conductor pipe on direct signal elimination for a transmitter—receiver spacing of 60 inches, in accordance with various embodiments. The effect of sensor shape and presence of the perfect electric conductor (PEC) pipe on direct signal elimination is shown for operation at frequency f=10 KHz, pipe radius $r_{pipe}$=4 inches, and a transmitter coil radius $r_{TR}$=4.5 inches. The coil radius is measured from its projection onto the plane transversal to the pipe axis. Curve 1201 shows the direct signal amplitude as a function of transmitter tilt angle modeled without sensors and mandrel considering a dipole separated by 60 inches. Curve 1202 shows the direct signal amplitude as a function of transmitter tilt angle modeled for sensors without a mandrel and sensor separation of 60 inches. Curve 1203 shows the direct signal amplitude as a function of transmitter tilt angle for full modeling with transmitting and receiving sensors tilted on a mandrel with sensor separation of 60 inches. The azimuthal angle is again assumed to be the same for the transmitter and the receiver for simplicity. FIG. 11 illustrates that both coil shape and presence of pipe have significant effect on the transmitter angle at which the elimination occurs. As a result, these effects can be taken into consideration in determining the tilt angles of the sensors.

In various embodiments, combination of sensors arranged at their respective angles for minimizing a direct coupling signal in an induction measurement can reduce cost and complexity of the induction system, relative to a traditional induction system, by reducing the number of receivers by half. In a traditional induction tool to address direct coupling, a bucking coil is included for every receiver coil. Effort and cost for manufacturing and calibrating each bucking coil is usually very high, since the tool are arranged to be geometrically precise. Moreover, time consuming techniques or a complex design are used to reduce capacitive coupling between the bucking coil and the main coil in traditional induction systems. Use of tilted coils, as taught herein, can avoid the implementation of a secondary antenna to address direct coupling and the abovementioned problems associated with this secondary antenna.

Figure 13:
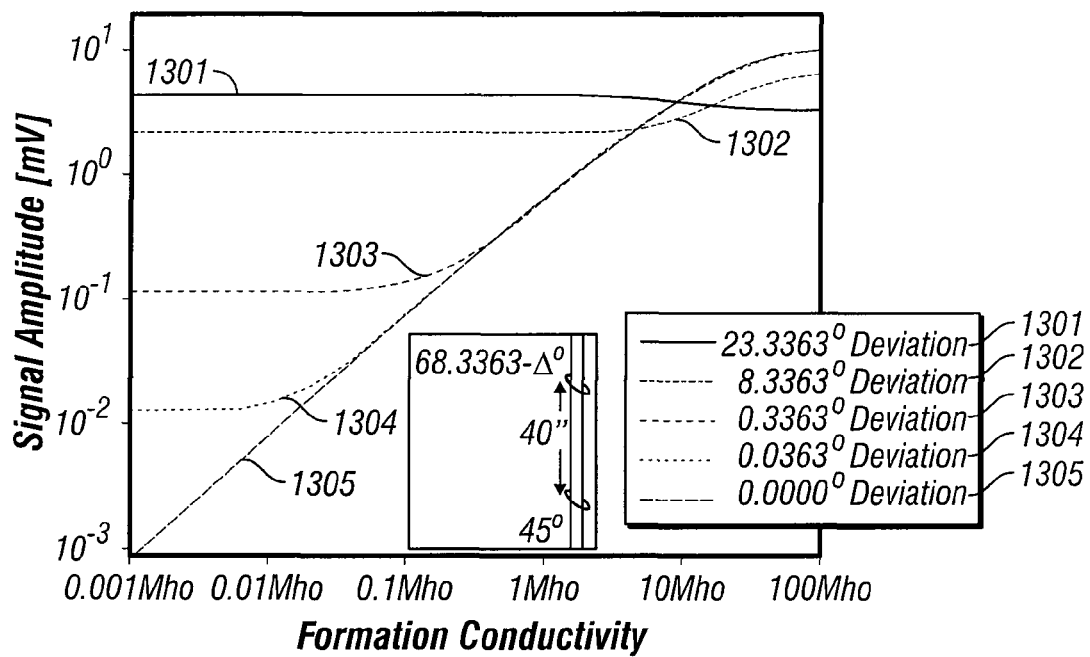
FIG. 13 shows received signal amplitude with respect to formation conductivity for different deviations in receiver tilt angle, in accordance with various embodiments.

FIG. 13 shows received signal amplitude with respect to formation conductivity for different deviations in receiver tilt angle, in accordance with various embodiments. A distance of 40 inches between the transmitter and receiver is used with a 45° and a 68.3363° tilt for the transmitter and receiver, respectively, and an operation frequency of 10 kHz is considered. Curve 1301 shows received signal amplitude with respect to formation conductivity for 23.3363° deviation. Curve 1302 shows received signal amplitude with respect to formation conductivity for 8.3363° deviation. Curve 1303 shows received signal amplitude with respect to formation conductivity for 0.3363° deviation. Curve 1304 shows received signal amplitude with respect to formation conductivity for 0.0363° deviation. Curve 1305 shows received signal amplitude with respect to formation conductivity for 0.0000° deviation. The tool parameters are originally designed to produce no direct coupling such that FIG. 13 illustrates measurement results due to deviations from these design parameters. As a result, at 0° deviation, the total signal is entirely composed of the formation signal and a linear relationship between formation conductivity and signal amplitude is observed. As the deviation increases, the direct coupling portion of the total signal increases and results in saturation of amplitude at low formation conductivity values.

For example, at a 0.3363° deviation for formation conductivity of 0.001 Mho, direct field contribution is approximately 0.1 mV. At a 5% multiplicative noise level, this produces a 0.005 mV noise in formation signal, which corresponds to a measurement lower limit of 0.006 Mho. Higher deviation in tilt angles produces an increase in this lower limit.

Figure 14:
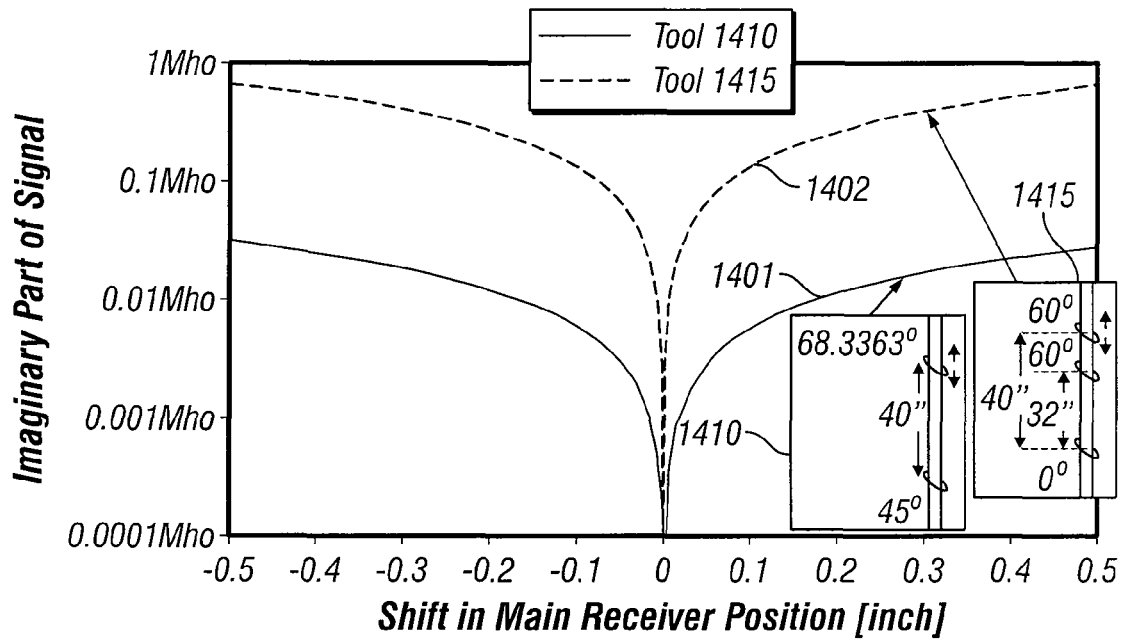
FIG. 14 illustrates the effect of deviation in position for a tool having a tilt configuration to address direct coupling in comparison to a traditional tool based on a bucking antenna, in accordance with various embodiments.

FIG. 14 illustrates the effect of deviation in position for a tool 1410 having a tilt configuration to address direct coupling in comparison to a traditional tool 1415 based on a bucking antenna, in accordance with various embodiments. The bucking antenna of traditional tool 1415 is the middle antenna at a distance of 32 inches to the transmitter. A distance of 40 inches between the transmitter and receiver is used for tool 1410 with 45° and 68.3363° tilt for the transmitter and receiver, respectively. In traditional tool 1415, the transmitter is chosen to be non-tilted and the receivers are tilted with 60° with a distance of 40 inches between transmitter and the receiver for collecting the measurement signal. Although a tilt angle for the receivers is not essential for bucking purposes in traditional tool 1415, it is included here for comparison purposes. In FIG. 14, the imaginary part of the signal is plotted, since it is can be better used in measuring direct coupling. The results are provided in terms of conductivity parameters (Mho), which are obtained from a receiver voltage by multiplying the receiver voltage with a tool constant. As is known, a tool constant for a given tool is a multiplicative constant, which is independent of formation conductivity, that correlates formation resistivity to the ratio of voltage and current of a resistivity measurement. Curve 1401 shows the imaginary part of the signal of tool 1410. Curve 1402 shows the imaginary part of the signal of tool 1415.

FIG. 14 shows that the direct coupling elimination effect in tool 1410 is more than 10 times less sensitive to changes in the sensor position for the whole range of shifts considered than in traditional tool 1415. In traditional tool 1415, an accuracy level of 0.01 Mho requires less than 0.01 inch precision in antenna positioning. On the other hand, in tool 1410, the same accuracy can be obtained at 0.16 inch precision.

Figure 15:
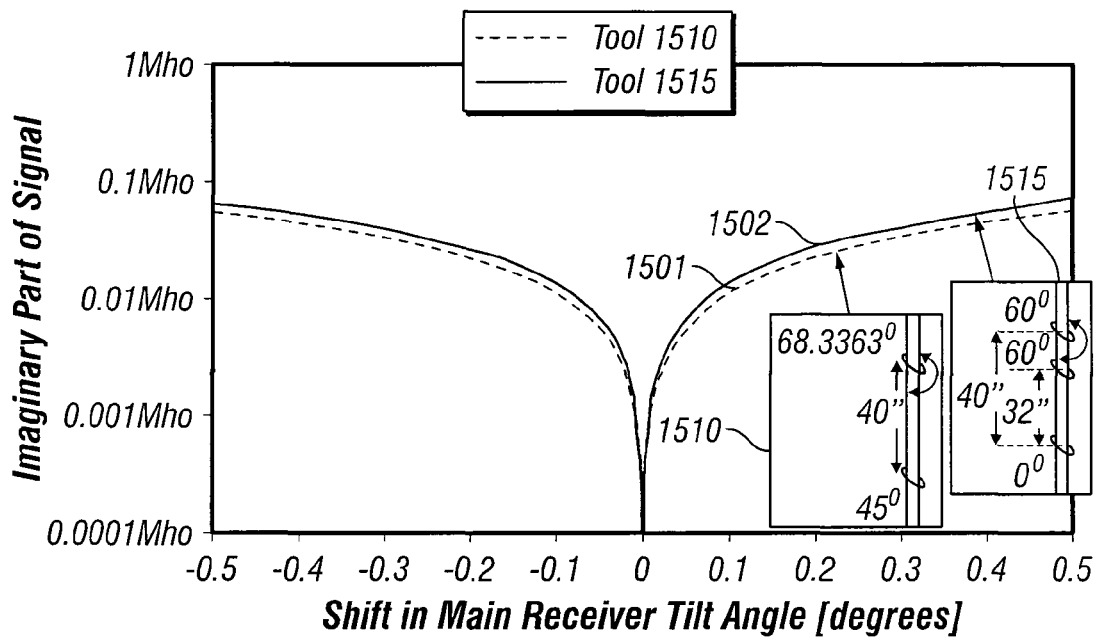
FIG. 15 illustrates the effect of deviation in tilt angle for a tool having a tilt configuration to address direct coupling in comparison to a traditional tool based on a bucking antenna, in accordance with various embodiments.

FIG. 15 illustrates the effect of deviation in tilt angle for a tool 1510 having a tilt configuration to address direct coupling in comparison to a traditional tool 1515 based on a bucking antenna in accordance with various embodiments. The bucking antenna of traditional tool 1515 is the middle antenna at a distance of 32 inches to the transmitter. A distance of 40 inches between the transmitter and receiver is used for tool 1510 with 45° and 68.3363° tilt for the transmitter and receiver, respectively. In traditional tool 1515, the transmitter is chosen to be non-tilted and the receivers are tilted with 60° with a distance of 40 inches between transmitter and the receiver for collecting the measurement signal. Although a tilt angle for the receivers is not essential for bucking purposes in traditional tool 1515, it is included here for a comparison purposes. As with FIG. 14, the imaginary part of the measured signal is considered with the results provided in terms of conductivity parameters (Mho). Curve 1501 shows the imaginary part of the signal of tool 1510. Curve 1502 shows the imaginary part of the signal of tool 1515. As shown in FIG. 15, both tool 1510 and traditional tool 1515 are similar in their sensitivity to deviations in tilt angle. An approximately 0.1° precision achieves 0.01 Mho measurement accuracy.

Figure 16:
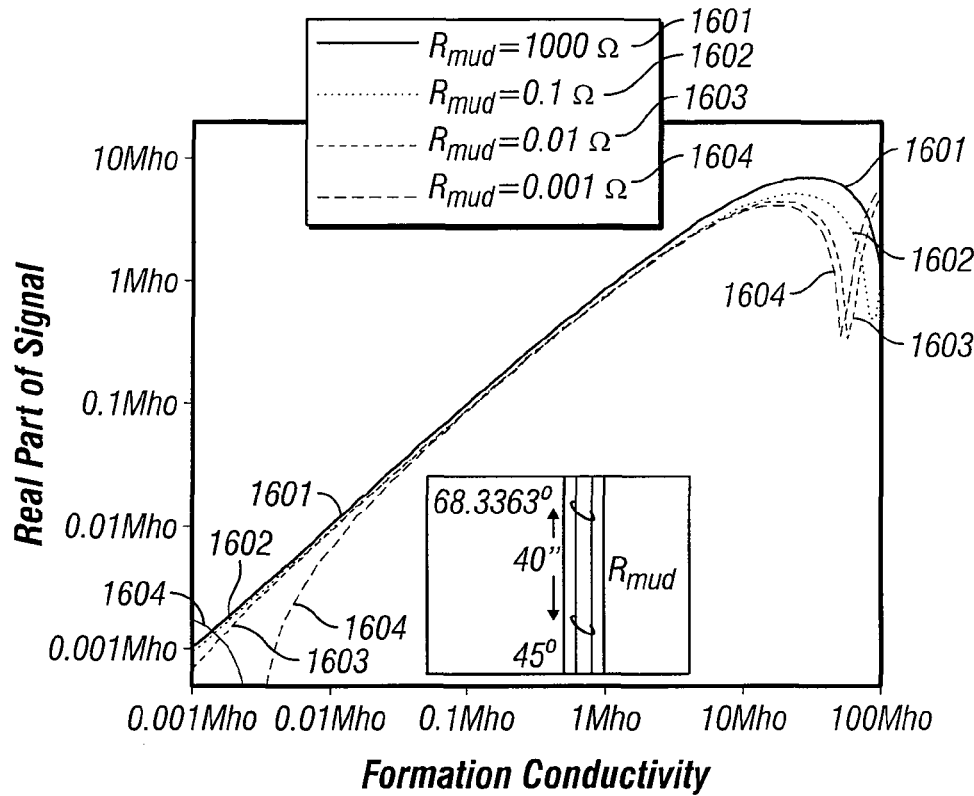
FIG. 16 illustrates the effect of the borehole on the received signal of a tool having a tilt configuration to address direct coupling, in accordance with various embodiments.

FIG. 16 illustrates the effect of the borehole on the received signal of a tool having a tilt configuration to address direct coupling, in accordance with various embodiments. The real part of the signal is plotted with respect to formation conductivity for different mud resistivity values. Radii of the pipe and borehole are chosen as $r_{pipe}=4$ inches and $r_{bh}=5$ inches, respectively. Radius of the coils are chosen as $r_{TR}=4.5$ inches measured from its projection onto the plane transversal to pipe axis. A distance of 40 inches between the transmitter and receiver is used with 45° and 68.3363° tilt for the transmitter and receiver, respectively, with an operation frequency of 10 kHz. Curve 1601 shows the real part of the received signal as a function of formation conductivity for a mud resistance of the borehole of $R_{mud}=1000\Omega$. Curve 1602 shows the real part of the received signal as a function of formation conductivity for a mud resistance of the borehole of $R_{mud}=0.1\Omega$. Curve 1603 shows the real part of the received signal as a function of formation conductivity for a mud resistance of the borehole of $R_{mud}=0.01\Omega$. Curve 1604 shows the real part of the received signal as a function of formation conductivity for a mud resistance of the borehole of $R_{mud}=0.001\Omega$. FIG. 16 indicates that the presence of borehole mud does not have a significant effect on the range of the resistivity reading for $R_{mud}<0.001$ $\Omega$m. In this range, the magnitude of the real part is slightly affected by presence of the borehole and this effect can be compensated via a borehole correction scheme as shown in FIG. 8.

Figure 17:
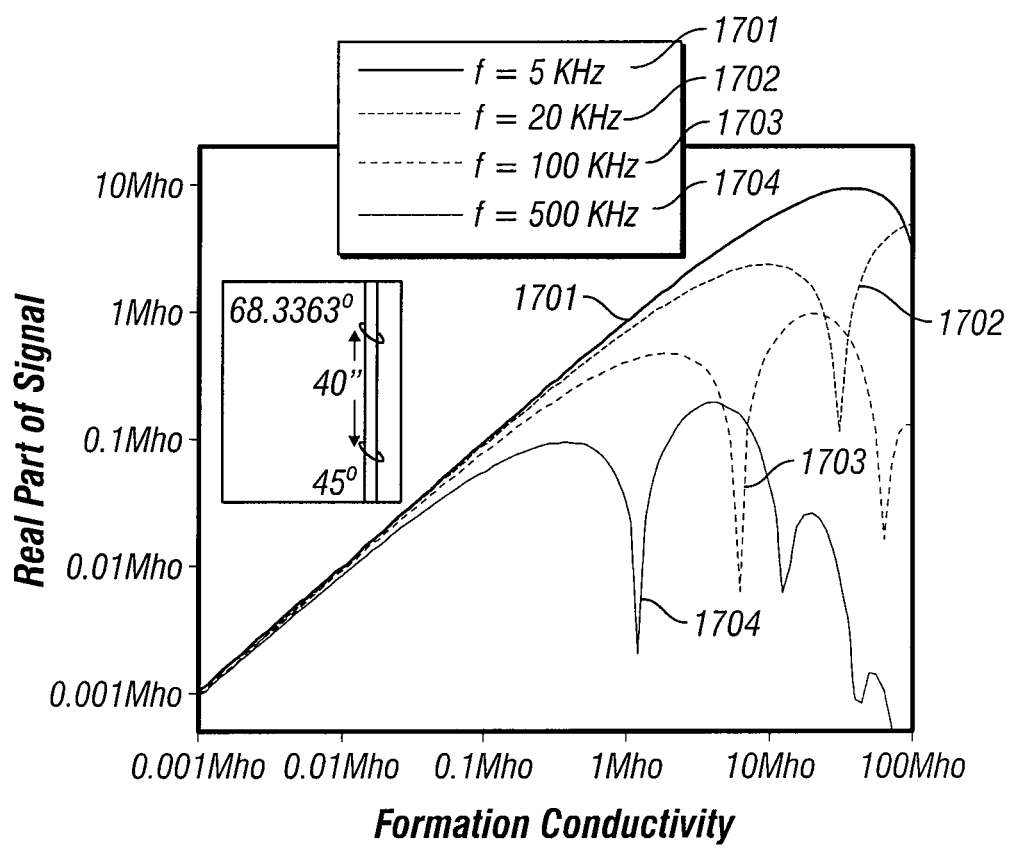
FIG. 17 shows the real part of the received signal with respect to formation conductivity for different frequency values of a tool having a tilt configuration to address direct coupling, in accordance with various embodiments.

FIG. 17 shows the real part of the received signal with respect to formation conductivity for different frequency values of a tool having a tilt configuration to address direct coupling, in accordance with various embodiments. A distance of 40 inches between the transmitter and receiver is used for the tool with 45° and 68.3363° tilt for the transmitter and receiver, respectively. Curve 1701 shows the real part of the received signal with respect to formation conductivity at 5 kHz. Curve 1702 shows real part of the received signal with respect to formation conductivity at 20 kHz. Curve 1703 shows the real part of the received signal with respect to formation conductivity at 100 kHz. Curve 1704 shows the real part of the received signal with respect to formation conductivity at 500 kHz. As shown in FIG. 17, there is a linear relationship between the received signal and formation conductivity, especially at low conductivity values. However, at each frequency this relationship breaks down as conductivity increases due to skin effect of the electromagnetic wave. As shown in FIG. 17, the skin effect can be reduced and pushed up in conductivity values by decreasing the operating frequency. It is generally more advantageous to have a wide range in the linear relationship, since non-linear parts are usually associated with uniqueness and instability problems in an inversion phase. With the tool considered in FIG. 17, at 20 KHz, it is possible to have a measurement range up to 10 Mho in formation conductivity. Although it is not apparent from the figure, there is also a lower limit associated with the measurement range. This lower limit is based on measurement noise and deviations in tool geometry as illustrated in FIGS. 13, 14, and 15. FIG. 17 indicates that of a tool having a tilt configuration to address direct coupling, in accordance with various embodiments, produces accurate readings for a wide range of resistivity values.

Figure 18:
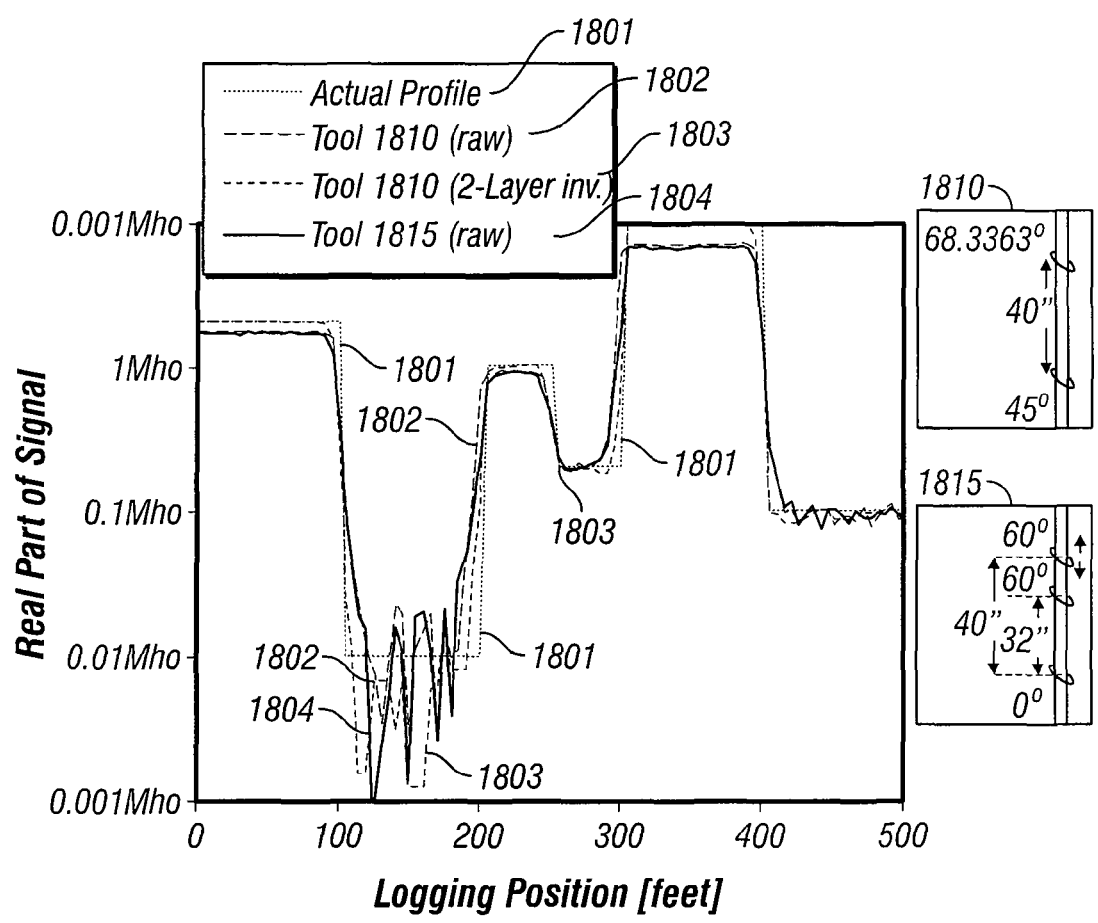
FIG. 18 shows logging result of a tool, having a tilt configuration to address direct coupling, and a traditional tool based on bucking antenna, in accordance with various embodiments.

FIG. 18 shows logging results of a tool 1810 having a tilt configuration to address direct coupling and a traditional tool 1815 based on bucking antenna, in accordance with various embodiments. For comparison, a separation of 40 inches between the transmitter and the farthest receiver is considered for both tools. In traditional tool 1815, the transmitter is chosen to be non-tilted and receivers are tilted with 60°. Although tilt angle for the receivers is not essential for bucking purposes in traditional tool 1815, it is included here for comparison. Bucking location in traditional tool 1815 is chosen to be at a distance of 32 inches from the transmitter. In tool 1810, 45° and 68.3363° tilt for the transmitter and receiver are used, respectively. Three operating frequencies, included in two layer inversion, are f=36, 72, and 144 KHz. However, only the 36 KHz result is shown in FIG. 18 for raw results. A 1% multiplicative factor and 0.001 Mho additive noise is included in the data for a realistic assessment.

Curve 1801 shows the actual profile of the medium. Curve 1802 shows raw results for tool 1810 obtained by multiplying the voltage by the tool constant. Curve 1803 shows results of a two-layer iterative inversion for tool 1810. Curve 1804 shows raw results for traditional tool 1815 obtained by multiplying the voltage by the tool constant. FIG. 18 illustrates that tool 1810 performs very similar to traditional tool 1815 in logging with curves 1802 and 1804 agreeing significantly. A two-layer inversion can improve the accuracy of the results by removing the skin effect and some of the shoulder effects. All layers considered were inverted successfully with some noise in the 0.01 and 0.1 Mho layers. Deep and accurate evaluation of formation in both wireline and LWD applications can be attained.

Figure 19:
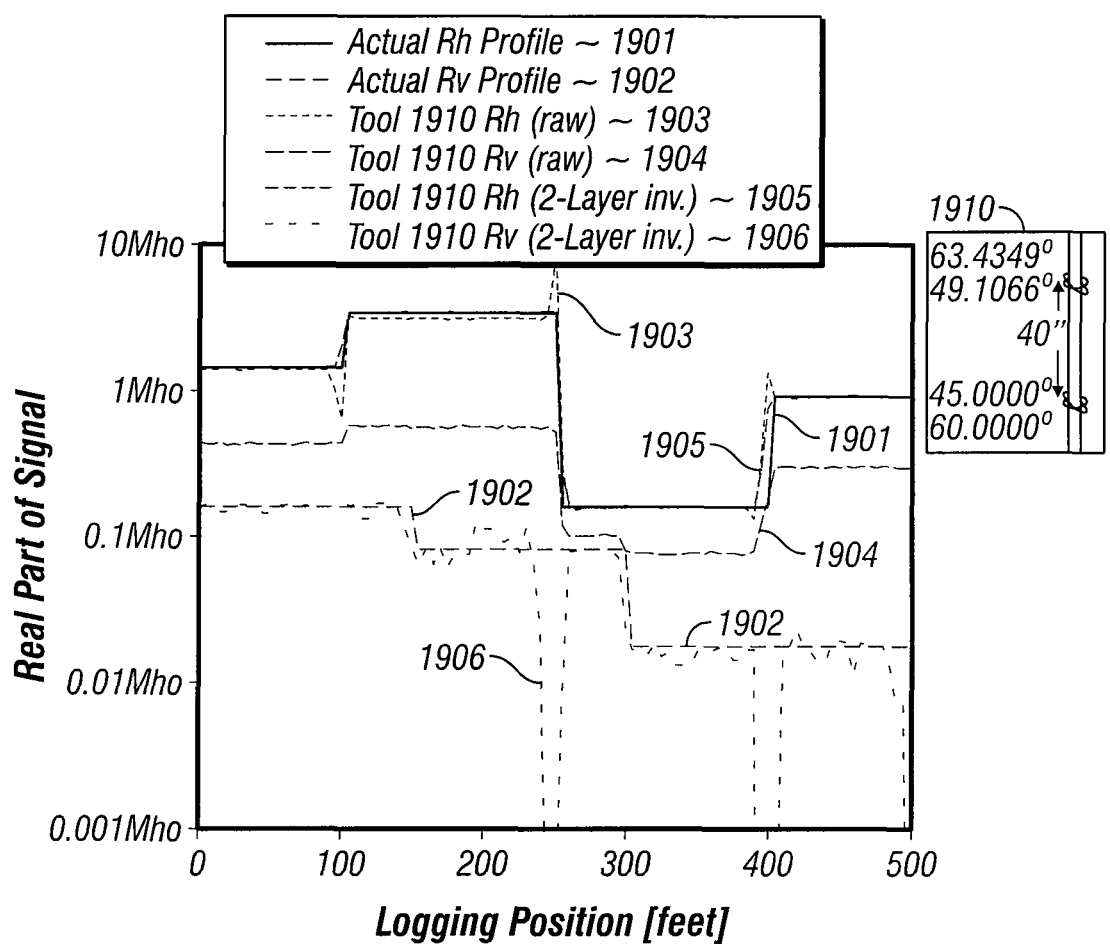
FIG. 19 shows logging results of a tool, having a tilt configuration to address direct coupling, in anisotropic media, in accordance with various embodiments.

FIG. 19 shows logging results of a tool 1910, having a tilt configuration to address direct coupling, in anisotropic media, in accordance with various embodiments. Tool 1910 includes two transmitters and two receivers. The centers of the transmitters are collocated and the centers of the receivers are collocated. The centers of the transmitters are separated from the centers of the receivers with a separation distance of 40 inches. Two measurements at different angle combinations can be taken to better capture the anisotropic behavior. The first measurement uses the combination from a 45.0000° transmitter to a 63.4349° receiver and the second measurement uses the combination from a 60.0000° transmitter to a 49.1066° receiver. Although collocation of the antennas improves the anisotropic measurement by matching effects of a possible shoulder layer, non-collocated antennas may also be used for anisotropic measurements. Anisotropic measurement may also be made, with somewhat less efficiency, by using same tilt angles and different positions for receivers. Three operating frequencies, included in two layer inversion, are f=36, 72, and 144 KHz. However, only the 36 KHz result is shown in FIG. 19 for the raw results. A 1% multiplicative factor and 0.001 Mho additive noise is included in the data for a realistic assessment.

Curve 1901 shows the actual $R_h$ profile of the medium. Curve 1902 shows the actual $R_v$ profile of the medium. Curve 1903 shows raw results for $R_h$ obtained by tool 1910. Curve 1904 shows raw results for $R_v$ obtained by tool 1910. Curve 1905 shows results for $R_h$ obtained by a two-layer iterative inversion for tool 1910. Curve 1906 shows results for $R_v$ obtained by a two-layer iterative inversion for tool 1910. FIG. 19 indicates that the raw measurements of curves 1903 and 1904 can partially capture the actual resistivity profiles shown in curves 1901 and 1902 with some discrepancy in the vertical resistivity reading. A two-layer iterative inversion shown in curves 1905 and 1906 can effectively correct for the discrepancy and provide accurate reading for both the horizontal and vertical resistivity.

In various embodiments, tools having tilt configurations to address direct coupling and methods of operating such tools provide a more efficient way to eliminate direct coupling in induction measurement than traditional tools that use bucking antennas. The number of required receivers can be reduced by half when compared to the traditional method, which simplifies the tool electronics and cost significantly. Further, similar to the traditional tools, accurate and deep evaluation of formations for a wide range of isotropic or anisotropic resistivity values are provided by these tools having tilt configurations to address direct coupling.

Various components of a measurement system including a tool, having a plurality of sensors titled with respect to a longitudinal axis of the tool to minimize reception of a direct coupling signal between sensors, and a processing unit, which can determine, from received formation signals, properties of the formation with respect to the borehole in which the tool is operating, as described herein or in a similar manner, can be realized in combinations of hardware and software implementations. The tool can have an arrangement of sensors along a longitudinal axis of the tool, where each sensor is tilted with respect to the longitudinal axis such that direct coupling between corresponding sensors can be substantially canceled with respect to each other due to the tilt in each of the corresponding sensors. These implementations may include a machine-readable medium having machine-executable instructions, such as a computer-readable storage medium having computer-executable instructions, for operating the system to control activation of the tool disposed in a borehole in an induction measurement, to acquire a signal in a sensor of the arrangement of sensors responsive to controlling the activation of the tool, to perform an inversion operation on data from the acquired signal to determine one or more properties of a formation, or permutations and/or combinations thereof.

The instructions can include instructions to generate one or more transmission signals and to apply the one or more transmission signals to one or more transmitting antennas in the arrangement of sensors and to acquire one or more received signals at one or more receiving antennas of the arrangement of sensors, where the one or more received signals correspond to the one or more transmission signals such that the received signals are substantially without a direct coupling signal between receiver antennas and corresponding transmitting antennas oriented at tilt angles to substantially cancel the direct coupling signal. The instructions may also include instructions to generate the one or more transmission signals within a frequency range of 100 Hz to 10 MHz and to transmit signals at multiple frequencies at the same time, or combinations thereof.

In various embodiments, operations using a machine-readable medium, having machine-executable instructions that be executed by one or more processors, in an induction measurement can include instructions to manage the measurement procedure. These instructions can include instructions to rotate the tool and collect data from different azimuthal angles during the rotation. The instructions can also include instructions to stop a drilling operation while making measurements. With the drilling operation stopped for a short period to make measurements, noise in the measurements can be reduced from that for measurements in which the drilling operations actively continue during the measurements.

In various embodiments, operations using a machine-readable medium, having machine-executable instructions that be executed by one or more processors, in an induction measurement can include instructions to manage the analysis of data signals from the measurement process. The instructions can include instructions to perform the inversion operation including matching the data signals to patterns in a signal library or using an iterative solver coupled with a forward model. The instructions can include instructions to analyze borehole contributions separate from conducting an inversion process on data signals to determine formation properties. These instructions can include instructions to make a borehole correction to the data using a borehole correction module to generate borehole corrected data and to match the borehole corrected data to patterns in a signal library or to use an iterative solver coupled with a forward model on the borehole corrected data such that one or more properties of a formation are provided. In addition, the instructions may include instructions to provide the borehole correction module with borehole parameters, determined along with the determination of formation parameters, as inputs to refine existing borehole parameters.

The instructions can be executed by a controller, or processor, to manage a direct coupling cancellation technique as discussed herein. The instructions can be realized as a processing unit or a portion of a processing unit that at least includes the functionality and capability of processing units described herein, for example, such as with respect to, but not limited to, FIGS. 1, 2, and 5-8. The instructions can include performing an inversion operation or inversion operations using a forward model or a library. The forward model and/or library can be stored in the same machine-readable medium, a different machine-readable medium, or distributed over machine-readable media at different locations. The instructions can include performing an inversion operation or inversion operations by performing an iterative process or performing a pattern matching process.

Figure 20:
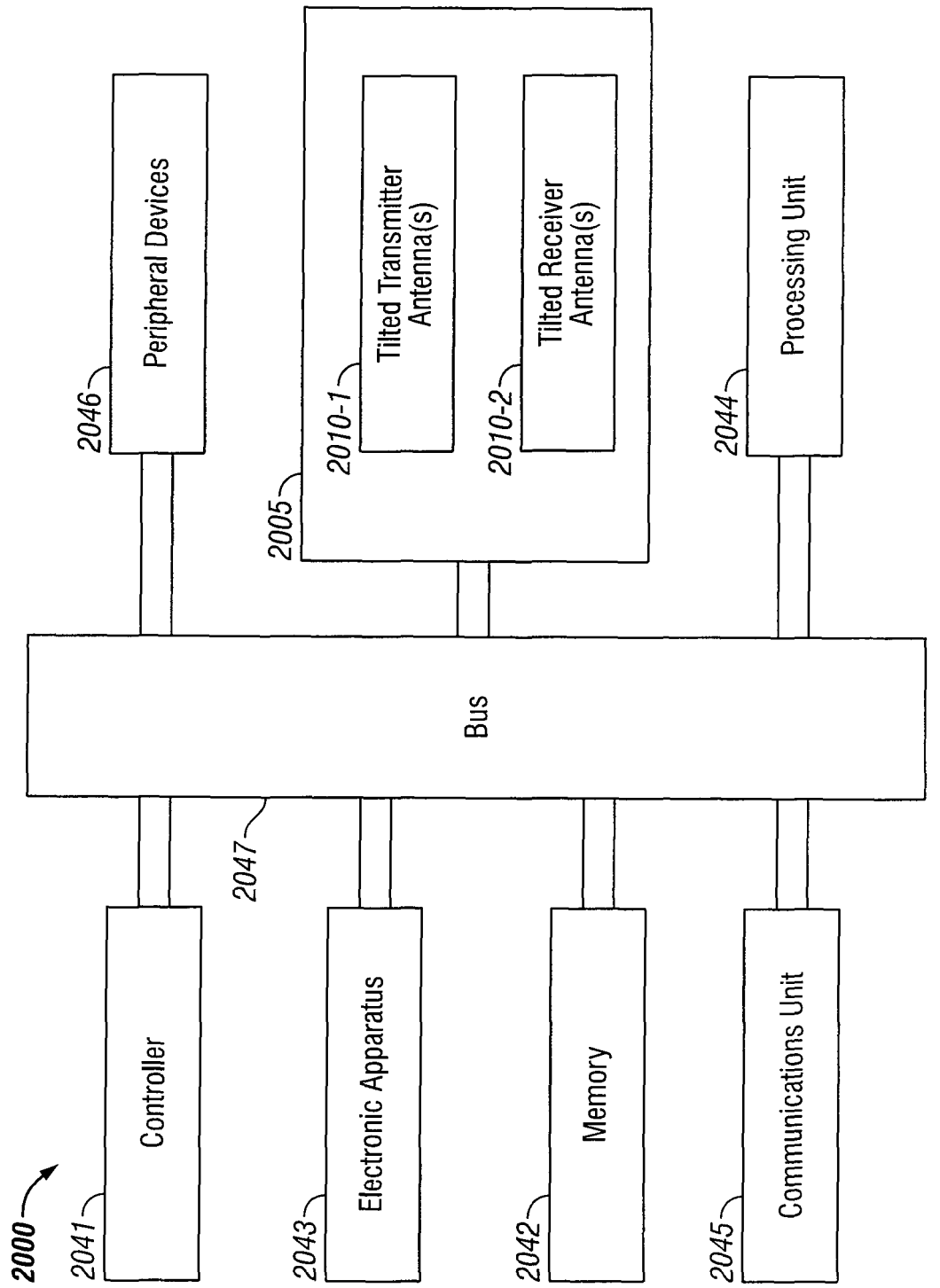
FIG. 20 depicts a block diagram of features of an example system having a tool configured with sensors arranged with a tilt angle with respect to a longitudinal axis of the tool such that minimization of a direct coupling signal between corresponding sensors is realized due to the tilt of these sensors, in accordance with various embodiments.

FIG. 20 depicts a block diagram of features of an example embodiment of a system 2000 having a tool configured with sensors arranged with a tilt angle with respect to a longitudinal axis of the tool such minimization of a direct coupling signal between corresponding sensors is realized due to the tilt of these sensors. System 2000 includes tool 2005 having an arrangement of tilted transmitter antennas 2010-1 and tilted receivers antennas 2010-2 that can be realized in a similar or identical manner to arrangements discussed herein.

System 2000 can include a controller 2041, a memory 2042, an electronic apparatus 2043, and a communications unit 2045. Controller 2041, memory 2042, and communications unit 2045 can be arranged to operate as a processing unit to control activation of tool 2005 and to perform one or more inversion operations on the signals collected by tool 205 to determine formation properties. A data processing unit, to engage in analysis of data in an induction measurement, can be distributed among the components of system 2000 including electronic apparatus 2043. Alternatively, system 2000 can include a processing unit 2044 to control activation of transmitter antennas and selection of receiver antennas in tool 2005 and to manage processing schemes in accordance with measurement procedures and signal processing as described herein. Processing unit 2044 and/or other components of system 2000 can be configured to operate similar to or identical to data processing unit 526, data buffer 524, data acquisition unit 522, and system controller center 520 of FIG. 5 and/or processing unit 626, data buffer 624, data acquisition unit 622, and system controller center 620 of FIG. 6.

Communications unit 2045 can include downhole communications for appropriately located sensors. Such downhole communications can include a telemetry system. Communications unit 2045 may use combinations of wired communication technologies and wireless technologies at frequencies that do not interfere with on-going measurements.

System 2000 can also include a bus 2047, where bus 2047 provides electrical conductivity among the components of system 2000. Bus 2047 can include an address bus, a data bus, and a control bus, each independently configured. Bus 2047 can be realized using a number of different communication mediums that allows for the distribution of components of system 2000. Use of bus 2047 can be regulated by controller 2041.

In various embodiments, peripheral devices 2046 can include displays, additional storage memory, and/or other control devices that may operate in conjunction with controller 2041 and/or memory 2042. In an embodiment, controller 2041 is realized as a processor or a group of processors that may operate independently depending on an assigned function. Peripheral devices 2046 can be arranged with a display, as a distributed component on the surface, that can be used with instructions stored in memory 2042 to implement a user interface to manage the operation of tool 2005 and/or components distributed within system 2000. Such a user interface can be operated in conjunction with communications unit 2045 and bus 2047.

Figure 21:
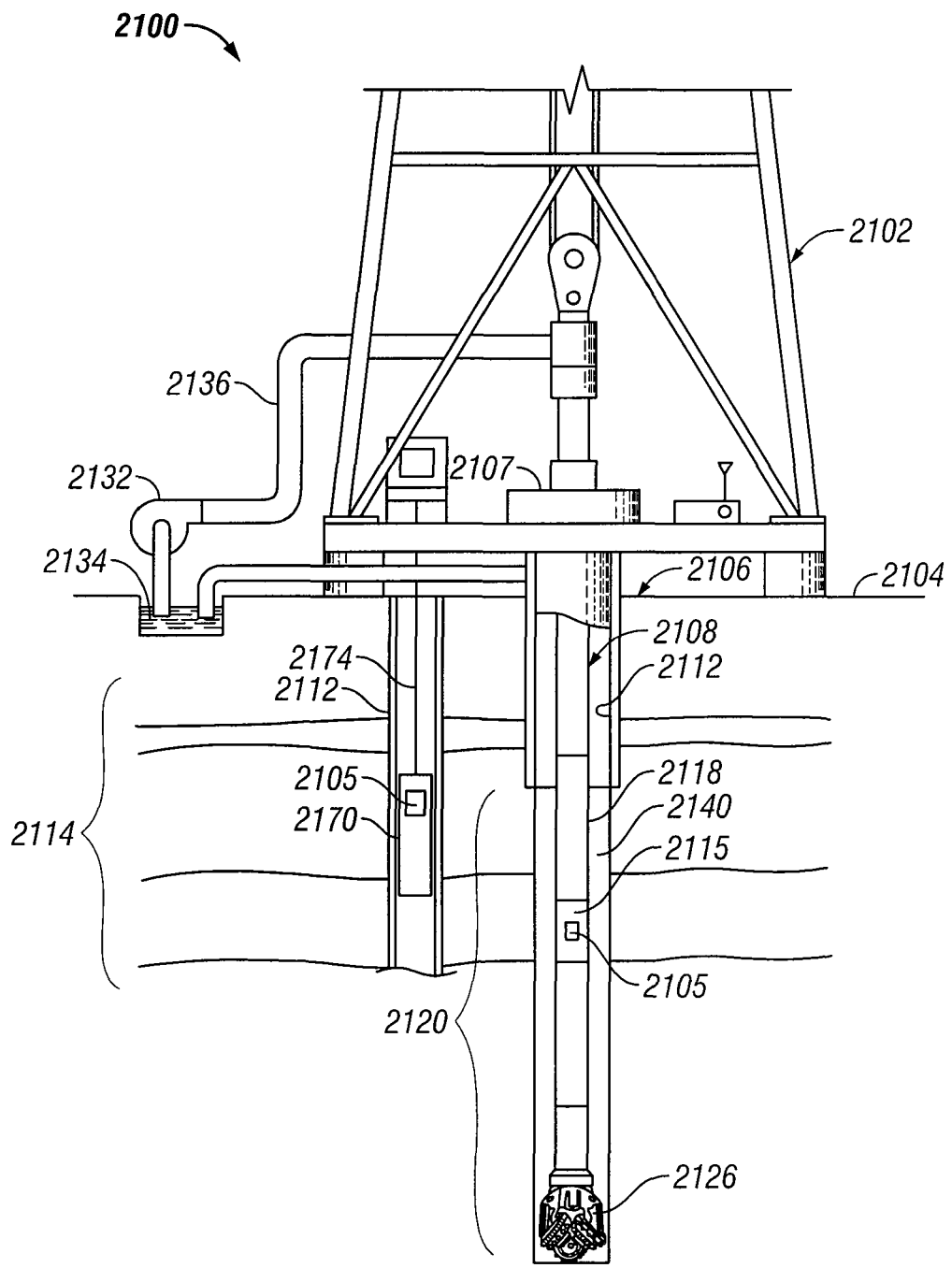
FIG. 21 depicts an embodiment of a system at a drilling site, where the system includes a measurement tool configured with sensors, where each sensor is arranged with a tilt angle with respect to a longitudinal axis of the tool such that minimization of a direct coupling signal between corresponding sensors is realized due to the tilt of these sensors, in accordance with various embodiments.

FIG. 21 depicts an embodiment of a system 2100 at a drilling site, where system 2100 includes a measurement tool 2105 configured with sensors, various of the sensors arranged with a tilt angle with respect to a longitudinal axis of the tool such that minimization of a direct coupling signal between corresponding sensors is realized due to the tilt of these sensors. System 2100 includes tool 2105 having arrangements of transmitters and receivers that can be realized in a similar or identical manner to arrangements discussed herein to minimize direct coupling between corresponding sensors based on tilt angles of these sensors. Measurement tool 2105 can be structured and fabricated in accordance with various embodiments as taught herein with respect to a sensor tool having an arrangement of tilted transmitters and receivers.

System 2100 can include a drilling rig 2102 located at a surface 2104 of a well 2106 and a string of drill pipes, that is, drill string 2108, connected together so as to form a drilling string that is lowered through a rotary table 2107 into a wellbore or borehole 2112. The drilling rig 2102 can provide support for drill string 2108. The drill string 2108 can operate to penetrate rotary table 2107 for drilling a borehole 2112 through subsurface formations 2114. The drill string 2108 can include drill pipe 2118 and a bottom hole assembly 2120 located at the lower portion of the drill pipe 2118.

The bottom hole assembly 2120 can include drill collar 2115, measurement tool 2105 attached to drill collar 2115, and a drill bit 2126. The drill bit 2126 can operate to create a borehole 2112 by penetrating the surface 2104 and subsurface formations 2114. Measurement tool 2105 can be structured for an implementation in the borehole of a well as a MWD system such as a LWD system. The housing containing measurement tool 2105 can include electronics to activate transmitters of measurement tool 2105 and collect responses from receivers of measurement tool 2105. Such electronics can include a processing unit to analyze signals sensed by measurement tool 2105 and provide measurement results to the surface over a standard communication mechanism for operating a well. Alternatively, electronics can include a communications interface to provide signals sensed by measurement tool 2105 to the surface over a standard communication mechanism for operating a well, where these sensed signals can be analyzed at a processing unit at the surface.

In various embodiments, measurement tool 2105 may be included in a tool body 2170 coupled to a logging cable 2174 such as, for example, for wireline applications. Tool body 2170 containing measurement tool 2105 can include electronics to activate transmitters of measurement tool 2105 and collect responses from receivers of measurement tool 2105. Such electronics can include a processing unit to analysis signals sensed by measurement tool 2105 and provide measurement results, such as formation properties, to the surface over a standard communication mechanism for operating a well. Alternatively, electronics can include a communications interface to provide signals sensed by measurement tool 2105 to the surface over a standard communication mechanism for operating a well, where these collected sensed signals are analyzed at a processing unit at the surface. Logging cable 2174 may be realized as a wireline (multiple power and communication lines), a mono-cable (a single conductor), and/or a slick-line (no conductors for power or communications), or other appropriate structure for use in bore hole 2112.

During drilling operations, the drill string 2108 can be rotated by the rotary table 2107. In addition to, or alternatively, the bottom hole assembly 2120 can also be rotated by a motor (e.g., a mud motor) that is located downhole. The drill collars 2115 can be used to add weight to the drill bit 2126. The drill collars 2115 also can stiffen the bottom hole assembly 2120 to allow the bottom hole assembly 2120 to transfer the added weight to the drill bit 2126, and in turn, assist the drill bit 2126 in penetrating the surface 2104 and subsurface formations 2114.

During drilling operations, a mud pump 2132 can pump drilling fluid (sometimes known by those of skill in the art as "drilling mud") from a mud pit 2134 through a hose 2136 into the drill pipe 2118 and down to the drill bit 2126. The drilling fluid can flow out from the drill bit 2126 and be returned to the surface 2104 through an annular area 2140 between the drill pipe 2118 and the sides of the borehole 2112. The drilling fluid may then be returned to the mud pit 2134, where such fluid is filtered. In some embodiments, the drilling fluid can be used to cool the drill bit 2126, as well as to provide lubrication for the drill bit 2126 during drilling operations. Additionally, the drilling fluid may be used to remove subsurface formation 2114 cuttings created by operating the drill bit 2126.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. An apparatus comprising:
a tool having an arrangement of sensors attached to the tool, wherein the arrangement of sensors comprises a transmitting sensor at a first tilt angle with respect to a longitudinal axis of the tool and a receiving sensor at a second tilt angle with respect to the longitudinal axis of the tool, wherein a transmission signal from the transmitting sensor at the first angle induces at the receiving sensor at the second angle a magnetic dipole that is perpendicular to a magnetic field corresponding to the transmission signal from the transmitting sensor at the first tilt angle, wherein the sensors include a plurality of transmitting antennas and receiving antennas arranged to provide images with different depth and resolution;

a control unit operable to manage generation of transmission signals from the arrangement of sensors and collection of received signals in the arrangement of sensors in response to the generation of the transmission signals; and a data processing unit to process data from the received signals.

2. The apparatus of claim 1, wherein the first and second tilt angles are approximately 54.68° with respect to the longitudinal axis.

3. The apparatus of claim 1, wherein the tilt angle of the transmitting sensor selected and the tilt angle of the receiving sensor selected are results of simulation or experimentation.

4. The apparatus of claim 1, wherein the control unit is operable to generate transmission signals at different frequencies and collect received signals corresponding to the transmission signals.

5. The apparatus of claim 1, wherein the data processing unit includes a signal library to perform numerical inversion on data generated from signals acquired at receiving antennas in the arrangement of sensors.

6. The apparatus of claim 1, wherein the data processing unit includes a borehole correction library to provide borehole correction prior to using a signal library to perform numerical inversion on data generated from signals acquired at receiving antennas in the arrangement of sensors.

7. The apparatus of claim 1, wherein the data processing unit is operable to provide layer properties and/or borehole properties using patterning matching and/or iterative processing.

8. A method comprising:

controlling activation of an arrangement of transmitting and receiving sensors attached to a tool disposed in a borehole, wherein controlling activation of the arrangement of sensors comprises activating a transmitting sensor having a first tilt angle with respect to a longitudinal axis of the tool to generate a transmission signal;

acquiring a signal from a receiving sensor having a second tilt angle with respect to the longitudinal axis of the tool, wherein acquiring the signal from the receiving sensor having the second tilt angle is based, at least in part, on the transmission signal inducing at the receiving sensor a magnetic dipole perpendicular to a magnetic field corresponding to the transmission signal from the transmitting sensor having the first tilt angle; and performing an inversion operation on data from the acquired signal to determine one or more properties of a formation.

9. The method of claim 8, wherein activating the transmitting sensor comprises activating the transmitting sensor to generate a plurality of transmission signals within a frequency range of 100 Hz to 10 MHz.

10. The method of claim 8, wherein controlling the activation of the arrangement of sensors comprises transmitting signals at multiple frequencies at the same time.

11. The method of claim 8, wherein the method includes rotating the tool and collecting data from different azimuthal angles during the rotation.

12. The method of claim 8, wherein the method includes stopping a drilling operation while making measurements.

13. The method of claim 8, wherein performing the inversion operation includes matching the data to patterns in a signal library or using an iterative solver coupled with forward model.

14. The method of claim 13, wherein performing the inversion operation includes:

making a borehole correction to the data using a borehole correction module to generate borehole corrected data; and matching the borehole corrected data to patterns in a signal library to provide the one or more properties of a formation or using an iterative solver coupled with forward model on the borehole corrected data to provide the one or more properties of a formation.

15. The method of claim 14, wherein the one or more properties of the formation are provided as inputs to making a borehole correction to refine existing borehole parameters.

16. The method of claim 8, further comprising determining the combination of the first and second tilt angles based on adjusting the tilt angles until detecting cancellation of direct coupling between the receiving sensor and the transmitting sensor.

17. The method of claim 16, wherein determining the combination of first and second tilt angles comprises performing simulations based on at least one of varying distance between the receiving sensor and the transmitting sensor, coil shape of the sensors, and whether the sensors are tilted on mandrels, or determining the combination of tilt angles comprises physically changing tilt angle combinations until zero direct coupling is observed.

18. A tool comprising:
a tool body; and
measurement electronics that comprise,
a first antenna and a second antenna attached to the tool body,
wherein the first antenna is at a first tilt angle with respect to a longitudinal axis of the tool and the second antenna is at a second tilt angle with respect to the longitudinal axis of the tool and the antennas are arranged to provide images of different depth and resolution,
wherein the combination of the first and second tilt angles corresponds to a magnetic dipole of the second antenna being perpendicular to a magnetic field corresponding to the first antenna, a transmitter and a receiver.

19. The tool of claim 18, wherein the first and the second tilt angles are both approximately 54.68° with respect to the longitudinal axis of the tool.

20. The tool of claim 18, wherein the combination of the first and second tilt angles is dependent upon distance between the first antenna and the second antenna.

21. The tool of claim 18, wherein the measurement electronics further comprise a third antenna attached to the tool body, wherein the third antenna is at a third tilt angle with respect to the longitudinal axis of the tool and the third antenna is at a different distance from the first antenna than the second antenna, wherein the combination of the first and third tilt angles corresponds to a magnetic dipole of the third antenna being perpendicular to a magnetic field corresponding to the first antenna.

22. The tool of claim 18, wherein the measurement electronics further comprise a third antenna attached to the tool body, wherein the third antenna is at approximately the first tilt angle and the first tilt angle is approximately 54.68° with respect to the longitudinal axis of the tool.

23. The tool of claim 18, wherein the measurement electronics further comprise:
   a third antenna and a fourth antenna attached to the tool body,
      wherein a combination of tilt angles of the third and fourth antennas is different than the combination of the first and the second tilt angles and wherein the combination of the tilt angles of the third and fourth antennas corresponds to a magnetic dipole of the fourth antenna being perpendicular to a magnetic field corresponding to the third antenna.

24. The tool of claim 23, wherein the tilt angle of the third antenna is approximately the first tilt angle and the tilt angle of the fourth antenna is different than the first tilt angle and the second tilt angle and the fourth antenna is a distance from the third antenna that different from a distance between the first and second antennas.

* * * * *